US012676278B2

(12) United States Patent
 Slot et al.

(10) Patent No.:  US 12,676,278 B2
(45) Date of Patent:       Jul. 7, 2026

(54) CHARGED PARTICLE APPARATUS AND METHOD

(71) Applicant: ASML Netherlands B.V., Veldhoven (NL)

(72) Inventors: Erwin Slot, Zoetermeer (NL); Mans Johan Bertil Osterberg, Rijswijk (NL)

(73) Assignee: ASML Netherlands B.V., Veldhoven (NL)

( * ) Notice: Subject to any disclaimer, the term of this patent is extended or adjusted under 35 U.S.C. 154(b) by 274 days.

(21) Appl. No.: 18/406,137

(22) Filed: Jan. 6, 2024

(65) Prior Publication Data

US 2024/0145208 A1      May 2, 2024

Related U.S. Application Data

(63) Continuation of application No. PCT/EP2022/066630, filed on Jun. 17, 2022.

(30) Foreign Application Priority Data

Jul. 7, 2021    (EP) ..................................... 21184292
Aug. 4, 2021    (EP) ..................................... 21189570

(51) Int. Cl.
 *H01J 37/14*          (2006.01)
 *H01J 37/141*         (2006.01)
 (Continued)

(52) U.S. Cl.
 CPC ............ *H01J 37/141* (2013.01); *H01J 37/28* (2013.01); *H01J 37/145* (2013.01); *H01J 37/1474* (2013.01)

(58) Field of Classification Search
 CPC ........ H01J 37/141; H01J 37/28; H01J 37/145; H01J 37/1474
 See application file for complete search history.

(56) References Cited

U.S. PATENT DOCUMENTS 5,168,166 A      12/1992  Hayakawa et al.
11,087,950 B2 *   8/2021  Sears ...................... H01J 37/06
                   (Continued)

FOREIGN PATENT DOCUMENTS

CN        108646167 A      10/2018
TW        201618151 A       5/2016
                   (Continued)

OTHER PUBLICATIONS

PCT International Search Report, corresponding with a PCT Application No. PCT/EP2022/066630, mailed on Oct. 11, 2022. (2 pages).

*Primary Examiner* — Nicole M Ippolito
(74) *Attorney, Agent, or Firm* — Finnegan, Henderson, Farabow, Garrett & Dunner LLP

(57) ABSTRACT

A charged particle apparatus, configured to project a charged particle multi-beam toward a sample, comprises: a charged particle source configured to emit a charged particle beam; a light source configured to emit light; and a charged particle-optical device configured to project toward the sample sub-beams of a charged particle multi-beam derived from the charged particle beam; wherein the light source is arranged such that the light is projected along paths of the sub-beams through the charged particle-optical device so as to irradiate at least a portion of the sample.

20 Claims, 12 Drawing Sheets

(51) Int. Cl.
    *H01J 37/28*      (2006.01)
    *H01J 37/145*     (2006.01)
    *H01J 37/147*     (2006.01)

(56)                References Cited

U.S. PATENT DOCUMENTS

| | | | |
|---|---|---|---|
| 2016/0189923 | A1 | 6/2016 | Juodkazis et al. |
| 2018/0364564 | A1 | 12/2018 | Goldenshtein et al. |
| 2021/0005423 | A1 | 1/2021 | Zeidler |
| 2021/0035773 | A1 | 2/2021 | Zeidler et al. |
| 2023/0038465 | A1* | 2/2023 | Effting ............... H01J 37/20 |
| 2024/0071716 | A1* | 2/2024 | Wieland ............... H01J 37/228 |

FOREIGN PATENT DOCUMENTS

| | | | |
|---|---|---|---|
| TW | 201910757 | A | 3/2019 |
| TW | 202029262 | A | 8/2020 |
| TW | 202102843 | A | 1/2021 |
| WO | 2015021506 | A1 | 2/2015 |
| WO | WO 2020/052943 | A1 | 3/2020 |
| WO | WO 2020/194575 | A1 | 10/2020 |

* cited by examiner

Fig. 1

CHARGED PARTICLE APPARATUS AND METHOD

CROSS-REFERENCE TO RELATED APPLICATIONS

This application claims priority of International application PCT/EP2022/066630, filed on 17 Jun. 2022, which claims priority of EP application 21184292.7, filed on 7 Jul. 2021, and of EP application 21189570.1, filed on 4 Aug. 2021. These applications are incorporated herein by reference in their entireties.

FIELD

The embodiments provided herein generally relate charged particle-optical devices, charged particle apparatuses and methods for projecting a charged particle multi-beam toward a sample.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons, or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample. The intensity of the electron beams comprising the backscattered electrons and the secondary electrons may vary based on the properties of the internal and external structures of the sample, and thereby may indicate whether the sample has defects.

When the primary electron beam scans the sample, charges may be accumulated on the sample due to large beam current, which may affect the quality of the image. The material structure may be illuminated with light and/or flooded with electrons in order to improve the defect contrast during defect inspection. For example, to regulate the accumulated charges on the sample, an Advanced Charge Controller (ACC) module may be employed to illuminate a light beam, such as a laser beam, on the sample, so as to control the accumulated charges due to effects such as photoconductivity, photoelectric, or thermal effects. It can be difficult to illuminate the light beam on the sample. For example, the dimensions of the pattern inspection tool may make it difficult to reach the sample with the light beam.

Additionally or alternatively, a flooding column may be provided for flooding the sample with electrons. The flooding column is separate from the SEM inspection column that focuses the beam of electrons onto the sample for inspection. Switching between the flooding column and the SEM inspection column can require movement of the sample so that the same part of the sample undergoes both processes. The movement can be a significant contributor to the overall time taken to perform the inspection.

SUMMARY

It is an object of the present disclosure to provide embodiments that support increasing the amount of light irradiated onto a sample for inspections involving improved defect contrast.

According to some embodiments of the present disclosure, there is provided a charged particle apparatus configured to project a charged particle multi-beam toward a sample, the charged particle apparatus comprising: a charged particle source configured to emit a charged particle beam; a light source configured to emit light; and a charged particle-optical device configured to project toward the sample sub-beams of a charged particle multi-beam derived from the charged particle beam; wherein the light source is arranged such that the light (or the light path) is projected along paths of the sub-beams through the charged particle-optical device so as to irradiate at least a portion of the sample.

According to some embodiments of the present disclosure, there is provided a method for projecting a charged particle multi-beam toward a sample, the method comprising: emitting a charged particle beam; projecting toward the sample sub-beams of a charged particle multi-beam derived from the charged particle beam using a charged particle-optical device; emitting light; and projecting the light (or the light paths) along paths of the sub-beams through the charged particle-optical device so as to irradiate the sample.

BRIEF DESCRIPTION OF FIGURES

The above and other aspects of the present disclosure will become more apparent from the description of exemplary embodiments, taken in conjunction with the accompanying drawings.

FIG. 1 is a schematic diagram illustrating an exemplary charged particle beam inspection apparatus.

Figure 2:
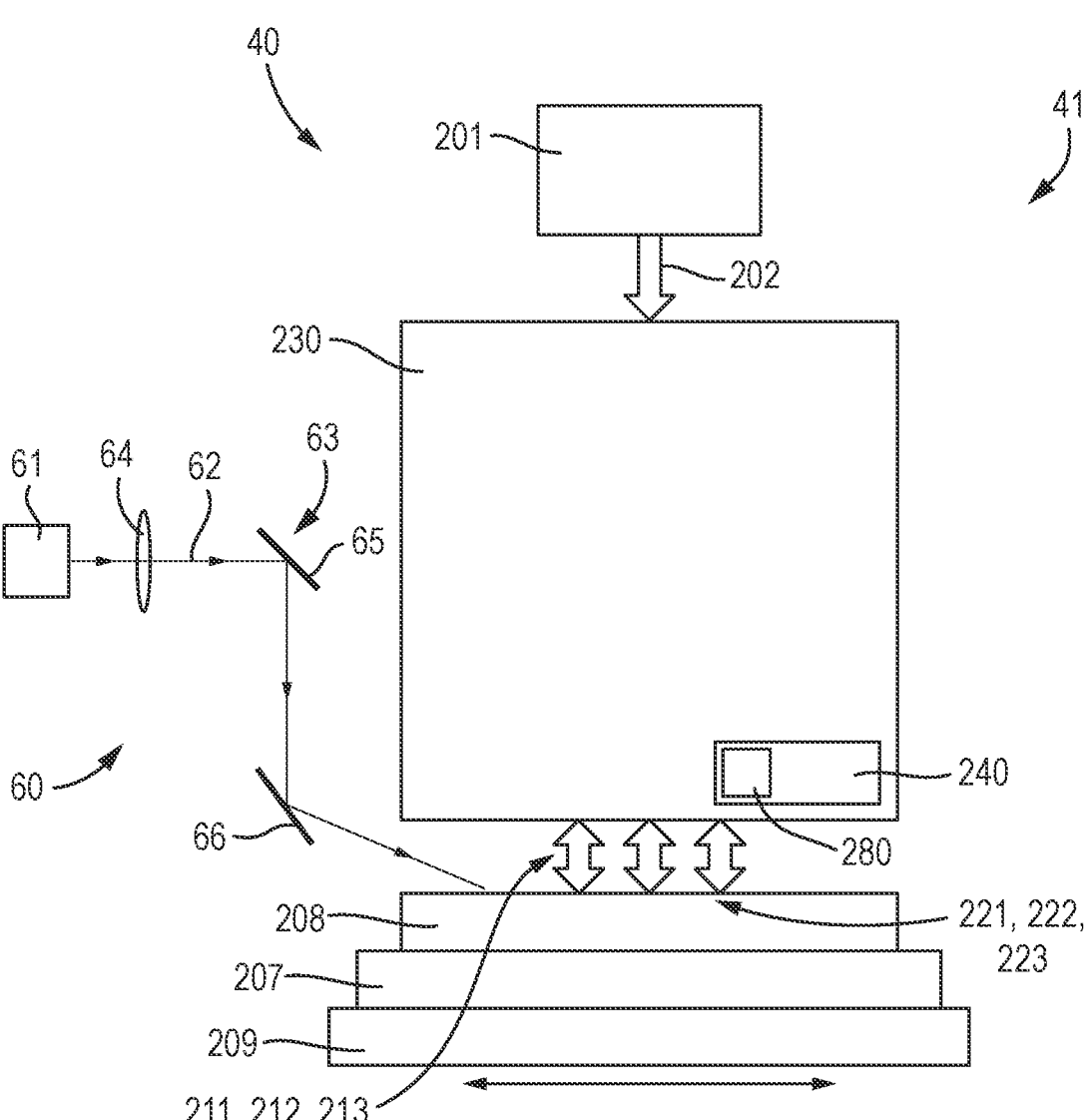
FIG. 2 is a schematic diagram illustrating an exemplary multi-beam charged particle apparatus that is part of the exemplary electron beam inspection apparatus of FIG. 1.

The schematic diagrams and views show the components described below. However, the components depicted in the figures are not to scale.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than 1/1000th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises a charged particle source, for generating primary charged particle s, and a projection apparatus for scanning a sample, such as a substrate, with one or more focused beams of primary charged particle s. Together at least the illumination apparatus, or illumination system, and the projection apparatus, or projection system, may be referred to together as the charged particle-optical system or apparatus. The primary charged particle s interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical system, it is appreciated that the embodiments are not used to limit the present disclosure to specific charged particles. References to electrons throughout the present document may therefore be more generally considered to be references to charged particles, with the charged particles not necessarily being electrons. For example, reference to an electron apparatus may be more generally considered to be reference to a charged particle apparatus.

Figure 1:
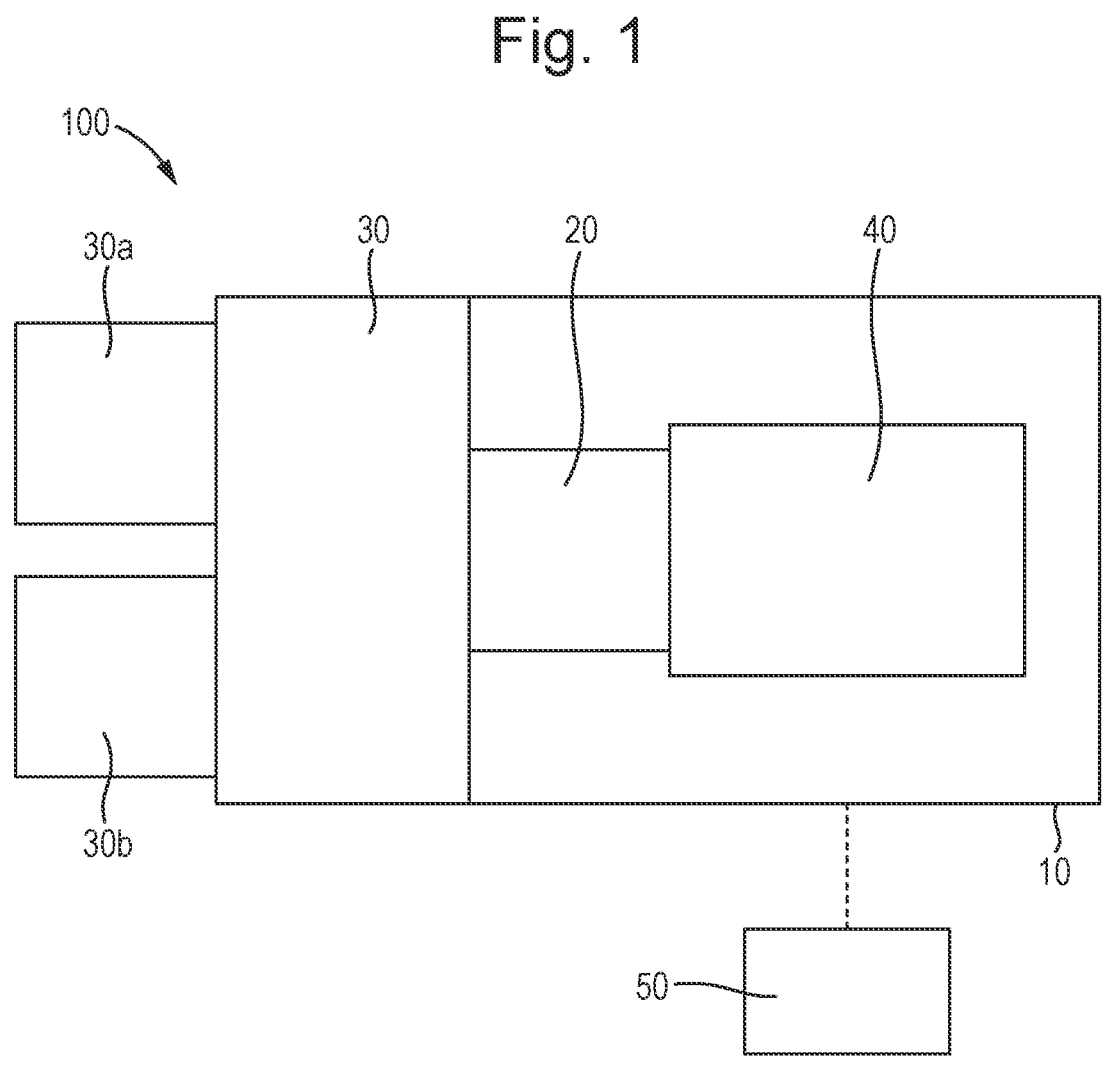

Reference is now made to FIG. 1, which is a schematic diagram illustrating an exemplary electron beam inspection apparatus 100. The electron beam inspection apparatus 100 of FIG. 1 includes a main chamber 10, a load lock chamber 20, an electron apparatus 40 (which may also be called an electron assessment apparatus or an electron beam system or tool), an equipment front end module (EFEM) 30 and a controller 50. The electron apparatus 40 is located within the main chamber 10.

The EFEM 30 includes a first loading port 30*a* and a second loading port 30*b*. The EFEM 30 may include additional loading port(s). The first loading port 30*a* and the second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in the EFEM 30 transport the samples to the load lock chamber 20.

The load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from the load lock chamber 20 to the main chamber 10. The main chamber 10 is connected to a main chamber vacuum pump system (not shown). The main chamber vacuum pump system removes gas particles in the main chamber 10 so that the pressure in around the sample reaches a second pressure lower than the first pressure. After reaching the second pressure, the sample is transported to the electron apparatus 40 by which it may be inspected. The electron apparatus 40 comprises an electron-optical device 41. The electron-optical device 41 may be an electron-optical column configured to project at least one electron beam towards the sample 208, and/or an objective lens module configured to focus at least one electron beam onto the sample 208. The electron-optical device may also comprise a detector module configured to detect electrons emitted from the sample 208, and/or a control lens module configured to adjust an electron-optical parameter of at least one electron beam. In some embodiments, the electron-optical column may comprise the objective lens module and the detector module and optionally the control lens module. In some embodiments, the electron-optical device comprises an objective lens assembly which may be comprised in the electron-optical column. The objective lens assembly comprises an objective lens array associated with (e.g. integrated with) one or more other electron-optical components such as a detector array and optionally a control lens array. The electron-optical device 41 may be a multi-beam electron-optical device 41 for a multi-beam projected towards the sample 208. In some embodiments, the electron-optical device 41 comprises multi-column comprising a plurality of electron-optical columns configured to project respective electron beam or electron multi-beams towards the sample 208.

The controller 50 is electronically connected to electron-optical components of the electron-optical device 41 of the electron apparatus 40. The controller 50 may be a processor (such as a computer) configured to control the electron beam inspection apparatus 100. The controller 50 may also include a processing circuitry configured to execute various signal and image processing functions. While the controller 50 is shown in FIG. 1 as being outside of the structure that includes the main chamber 10, the load lock chamber 20, and the EFEM 30, it is appreciated that the controller 50 may be part of the structure. The controller 50 may be located in one of the component elements of the electron beam inspection apparatus 100 or it can be distributed over at least two of the component elements. The controller may be considered to be part of the electron-optical device 41. While the present disclosure provides examples of the main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Reference is now made to FIG. 2, which is a schematic diagram illustrating an exemplary electron apparatus 40 including a multi-beam electron-optical device 41 that is part of the exemplary electron beam inspection apparatus 100 of FIG. 1. The multi-beam electron-optical device 41 comprises an electron source 201 and a projection apparatus 230. The electron apparatus 40 further comprises a motorized stage 209 and a sample holder 207. The projection apparatus 230 may be referred to as the electron-optical device 41. The sample holder 207 is supported by motorized stage 209 so as to hold a sample 208 (e.g., a substrate or a mask) for inspection. The multi-beam electron-optical device 41 may further comprise a detector 240 (e.g. an electron detection device).

The electron source 201 may comprise a cathode (not shown) and an extractor or anode (not shown). During operation, the electron source 201 is configured to emit electrons as primary electrons from the cathode. The primary electrons are extracted or accelerated by the extractor and/or the anode to form a primary electron beam 202.

The projection apparatus 230 is configured to convert the primary electron beam 202 into a plurality of sub-beams 211, 212, 213 and to direct each sub-beam onto the sample 208. Although three sub-beams are illustrated for simplicity, there may be many tens, many hundreds or many thousands of sub-beams. The sub-beams may be referred to as beam-lets.

The controller 50 may be connected to various parts of the electron beam inspection apparatus 100 of FIG. 1, such as the electron source 201, the detector 240, the projection apparatus 230, and the motorized stage 209. The controller 50 may perform various image and signal processing functions. The controller 50 may also generate various control signals to govern operations of the electron beam inspection apparatus 100, including the multi-beam electron apparatus 40.

The projection apparatus 230 may be configured to focus sub-beams 211, 212, and 213 onto a sample 208 for inspection and may form three probe spots 221, 222, and 223 on the surface of sample 208. The projection apparatus 230 may be configured to deflect the primary sub-beams 211, 212, and 213 to scan the probe spots 221, 222, and 223 across individual scanning areas in a section of the surface of the sample 208. In response to incidence of the primary sub-beams 211, 212, and 213 on the probe spots 221, 222, and 223 on the sample 208, electrons are generated from the sample 208 which include secondary electrons and backscattered electrons. The secondary electrons typically have electron energy $\leq 50$ eV. Actual secondary electrons can have an energy of less than 5 eV, but anything beneath 50 eV is generally treated at a secondary electron. Backscattered electrons typically have electron energy between 0 eV and the landing energy of the primary sub-beams 211, 212, and 213. As electrons detected with an energy of less than 50 eV is generally treated as a secondary electron, a proportion of the actual backscatter electrons will be counted as secondary electrons.

The detector 240 is configured to detect signal particles such as secondary electrons and/or backscattered electrons and to generate corresponding signals which are sent to a signal processing system 280, e.g. to construct images of the corresponding scanned areas of sample 208. The detector 240 may be incorporated into the projection apparatus 230.

The signal processing system 280 may comprise a circuit (not shown) configured to process signals from the detector 240 so as to form an image. The signal processing system 280 could otherwise be referred to as an image processing system. The signal processing system may be incorporated into a component of the multi-beam electron apparatus 40 such as the detector 240 (as shown in FIG. 2). However, the signal processing system 280 may be incorporated into any components of the electron beam inspection apparatus 100 or multi-beam electron apparatus 40, such as, as part of the projection apparatus 230 or the controller 50. The signal processing system 280 may include an image acquirer (not shown) and a storage device (not shown). For example, the signal processing system may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to the detector 240 permitting signal communication, such as an electrical conductor, optical fiber cable, portable storage media, IR, Bluetooth, internet, wireless network, wireless radio, among others, or a combination thereof. The image acquirer may receive a signal from the detector 240, may process the data comprised in the signal and may construct an image therefrom. The image acquirer may thus acquire images of the sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The signal processing system 280 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of the sample 208. The reconstructed images can thereby be used to reveal any defects that may exist in the sample.

The controller 50 may control the motorized stage 209 to move sample 208 during inspection of the sample 208. The controller 50 may enable the motorized stage 209 to move the sample 208 in a direction, preferably continuously, for example at a constant speed, at least during sample inspection. The controller 50 may control movement of the motorized stage 209 so that it changes the speed of the movement of the sample 208 dependent on various parameters. For example, the controller 50 may control the stage speed (including its direction) depending on the characteristics of the inspection steps of scanning process.

Known multi-beam systems, such as the electron apparatus 40 and electron beam inspection apparatus 100 described above, are disclosed in US2020118784, US20200203116, US 2019/0259570 and US2019/0259564 which are hereby incorporated by reference.

As shown in FIG. 2, in some embodiments, the electron apparatus 40 comprises a projection assembly 60. The projection assembly 60 may be a module and may be referred to as an ACC module. The projection assembly 60 is arranged to direct a light beam 62 such that the light beam 62 enters between the electron-optical device 41 and the sample 208.

When the electron beam scans the sample 208, charges may be accumulated on the sample 208 due to large beam current, which may affect the quality of the image. To regulate the accumulated charges on the sample, the projection assembly 60 may be employed to illuminate the light beam 62 on the sample 208, so as to control the accumulated charges due to effects such as photoconductivity, photoelectric, or thermal effects.

In some embodiments, the projection system 60 comprises a light source 61. The light source 61 is configured to emit the light beam 62. In some embodiments, the light source 61 is a laser light source. Laser light provides a coherent light beam 62. However, other types of light source can alternatively be used. In some embodiments, the light source 61 is configured to emit a light beam 62 having a wavelength in the range of from 450 nm to 850 nm.

In some embodiments, the projection assembly 60 comprises an optical system 63. In some embodiments, the optical system 63 is configured to focus the light beam 62 to be narrower in a direction perpendicular to the surface of the sample 208 than in a direction parallel to the surface. In some embodiments, the optical system 63 comprises a cylindrical lens 64. The cylindrical lens 64 is configured to focus the light beam 62 more in one direction than in an orthogonal direction. The cylindrical lens increases the design freedom for the light source 61. In some embodiments, the light source 61 is configured to emit a light beam 62 having a circular cross section. The cylindrical lens 64 is configured to focus the light beam 62 such that the light beam has an elliptical cross section. In some embodiments, the optical system 63 comprises reflecting surfaces 65, 66 such as mirrors. For example two reflecting surfaces 65, 66 may be provided.

Components of an electron apparatus 40 that may be used are described below in relation to FIG. 3, which is a schematic diagram of an electron apparatus 40. The electron apparatus 40 of FIG. 3 may correspond to the electron apparatus 40 (which may also be referred to as a system or a tool) mentioned above.

The electron source 201 directs electrons toward an array of condenser lenses 231 (otherwise referred to as a condenser lens array). The electron source 201 is desirably a high brightness thermal field emitter with a good compromise between brightness and total emission current. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an electron beam, for example from the source, into a plurality of sub-beams, with the array providing a lens for each sub-beam. The array of condenser lenses 231 may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses 231 is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

Each condenser lens 231 in the array directs electrons into a respective sub-beam 211, 212, 213 which is focused at a respective intermediate focus down beam of the condenser lens array. The sub-beams diverge with respect to each other. In some embodiments, deflectors 235 are provided at the intermediate focuses. The deflectors 235 are positioned in the sub-beam paths at, or at least around, the position of the corresponding intermediate points of focus. The deflectors 235 are positioned in or close to the sub-beam paths at the intermediate image plane of the associated sub-beam. The deflectors 235 are configured to operate on the respective sub-beams 211, 212, 213. The deflectors 235 are configured to bend a respective sub-beam 211, 212, 213 by an amount effective to ensure that the principal ray (which may also be referred to as the beam axis) is incident on the sample 208 substantially normally (i.e. at substantially 90° to the nominal surface of the sample). The deflectors 235 may be referred to as collimators or collimator deflectors. The deflectors 235 in effect collimate the paths of the sub-beams so that before the deflectors, the sub-beam paths with respect to each other are diverging. Down beam of the deflectors the sub-beam paths are substantially parallel with respect to each other, i.e. substantially collimated. Suitable collimators are deflectors disclosed in EP Application 20156253.5 filed on 7 Feb. 2020 which is hereby incorporated by reference with respect to the application of the deflectors to a multi-beam array. The collimator may comprise a macro collimator 270 (e.g. as shown in FIG. 4), instead of, or in addition to the deflectors 235. Thus, the macro-collimator 270 described below in relation to FIG. 4 may be provided with the features of FIG. 3. This is generally less preferred than providing the collimator array as deflectors 235.

Below (i.e. down beam or further from electron source 201) the deflectors 235 there is a control lens array 250. The sub-beams 211, 212, 213 having passed through the deflectors 235 are substantially parallel on entry to the control lens array 250. The control lenses pre-focus the sub-beams (e.g. apply a focusing action to the sub-beams prior to the sub-beams reaching the objective lens array 241). The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations.

In further detail, it is desirable to use the control lens array 250 to determine the landing energy. However, it is possible to use in addition the objective lens array 241 to control the landing energy. In such a case, a potential difference over the objective lens is changed when a different landing energy is selected. One example of a situation where it is desirable to partly change the landing energy by changing the potential difference over the objective lens is to prevent the focus of the sub-beams getting too close to the objective lenses. In such a situation there is a risk of components of the objective lens array 241 having to be too thin to be manufacturable. The same may be said about a detector at this location. This situation can for example occur in case the landing energy is lowered. This is because the focal length of the objective lens roughly scales with the landing energy used. By lowering the potential difference over the objective lens, and thereby lowering the electric field inside the objective lens, the focal length of the objective lens is made larger again, resulting in a focus position further below the objective lens. Note that use of just an objective lens would limit control of magnification. Such an arrangement could not control demagnification and/or opening angle. Further, using the objective lens to control the landing energy could mean that the objective lens would be operating away from its optimal field strength. That is unless mechanical parameters of the objective lens (such as the spacing between its electrodes) could be adjusted, for example by exchanging the objective lens.

The control lens array 250 comprises a plurality of control lenses. Each control lens comprises at least one electrode, preferably two electrodes (e.g. two or three electrodes) connected to respective potential sources. The control lens array 250 may comprise one or more (e.g. three) plate electrode arrays connected to respective potential sources. The control lens array 250 is associated with the objective lens array 241 (e.g. the two arrays are positioned close to each other and/or mechanically connected to each other and/or controlled together as a unit). Each control lens may be associated with a respective objective lens. The control lens array 250 is positioned up-beam of the objective lens array 241.

The control lens array 250 may be considered as one or more electrodes additional to the electrodes of the objective lens array 241. The control lens array 250 provides extra degrees of freedom for controlling the sub-beams. A greater number of electrodes comprised in the control lens array 250 provides a greater number of degrees of freedom. For example, these extra electrodes may permit landing energy and/or magnification control independent of the field strength of the objective lens array 241. In some designs the control lens may thus be part of the objective lens. Reference to such electrodes may thus be as part of the objective lens rather than a separate lens such as a control lens. Reference to a control lens in such an arrangement is reference to functionally equivalent electrodes of the objective lens.

The control lens array 250 comprises a control lens for each sub-beam 211, 212, 213. A function of the control lens array 250 is to optimize the beam opening angle with respect to the demagnification of the beam and/or to control the beam energy delivered to the objective lens array 241 which directs the sub-beams 211, 212, 213 onto the sample 208. The objective lens array 241 may be positioned at or near the base of the electron-optical device 41 (or also referred to as electron-optical system). The control lens array 250 is optional, but is preferred for optimizing a sub-beam up-beam of the objective lens array 241.

Figure 3:
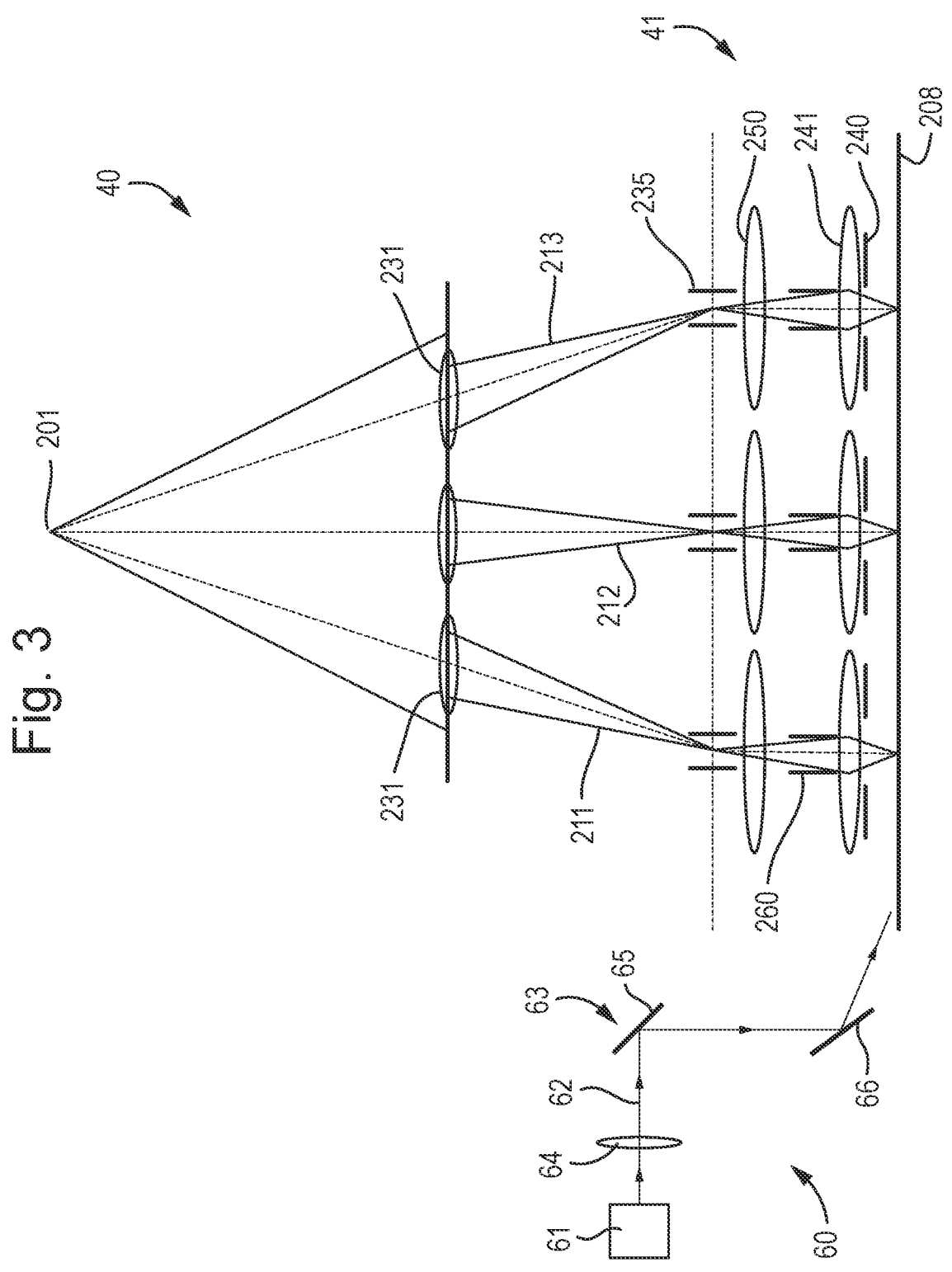
FIG. 3 is a schematic diagram of an exemplary multi-beam charged particle apparatus.
Figure 4:
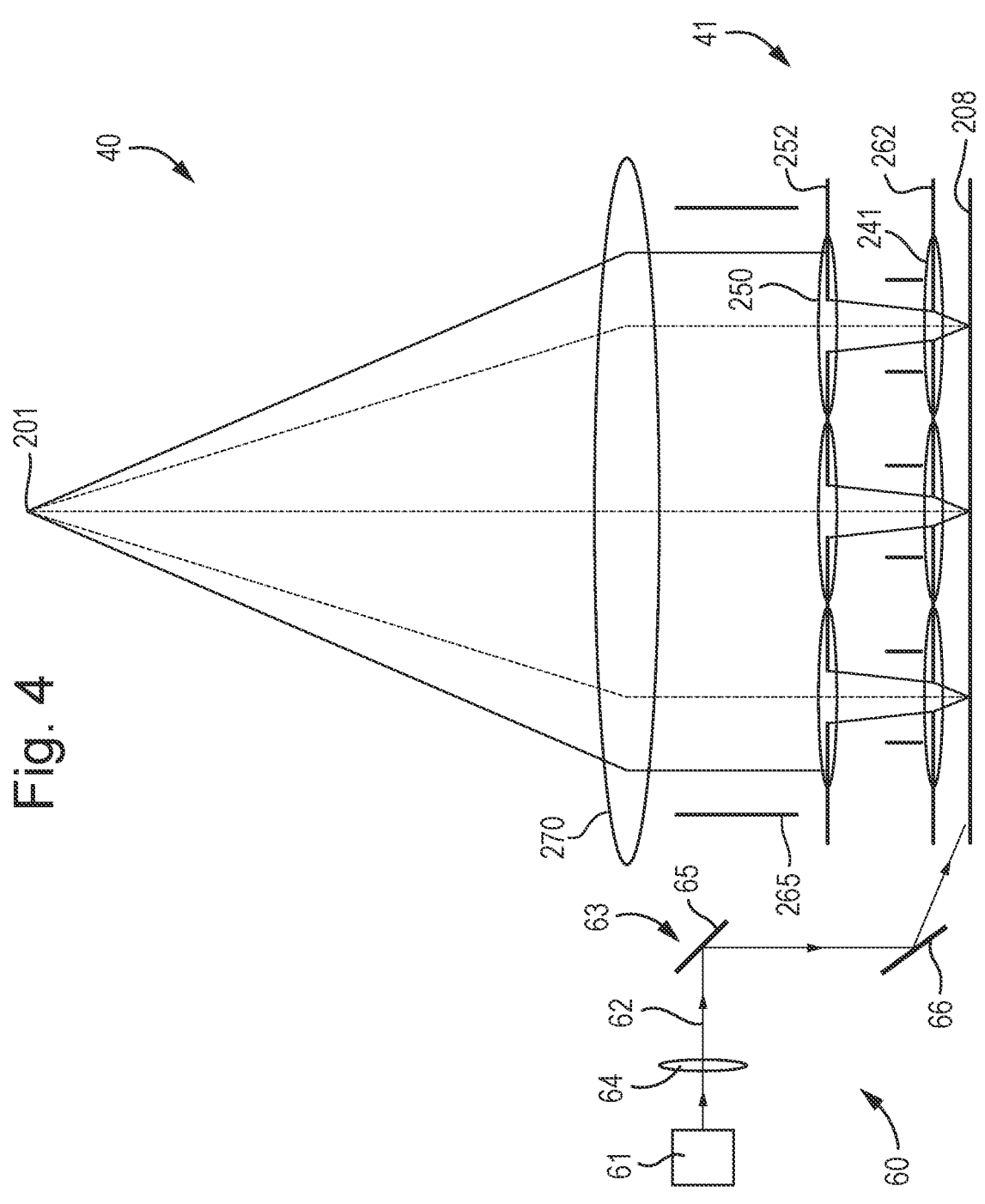
FIG. 4 is a schematic diagram of an exemplary charged particle apparatus comprising a macro collimator and macro scan deflector.

For ease of illustration, lens arrays are depicted schematically herein by arrays of oval shapes (as shown in FIG. 3). Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. Lens arrays may instead comprise multiple plates with apertures, for example a lens array may be an electrostatic lens array e.g. comprising multiple plates which may be considered to be electrodes.

Optionally, an array of scan deflectors 260 is provided between the control lens array 250 and the array of objective lenses 234. The array of scan deflectors 260 comprises a scan deflector for each sub-beam 211, 212, 213. Each scan deflector is configured to deflect a respective sub-beam 211, 212, 213 in one or two directions so as to scan the sub beam across the sample 208 in one or two directions.

FIG. 4 is a schematic diagram of an exemplary electron apparatus 40 comprising a macro collimator 270 and macro scan deflector 265. The electron source 201 directs electrodes toward a macro collimator 270. The electron source 201 is desirably a high brightness thermal field emitter with a good compromise between brightness and total emission current.

Sub-beams may be derived from the beam, for example, using a sub-beam forming array 252 (also known as a beam limiting aperture array) defining an array of beam-limiting apertures. The beam may separate into the sub-beams on meeting the control lens array 250, described below. The sub-beams are substantially parallel on entry to the control lens array 250.

The macro collimator 270 acts on the beam from the source 201 before the beam has been split into a multi-beam. The macro collimator 270 bends respective portions of the beam by an amount effective to ensure that a beam axis of each of the sub-beams derived from the beam is incident on the sample 208 substantially normally (i.e. at substantially 90° to the nominal surface of the sample 208). Thus the path of each sub-beam is at least intended to be orthogonal to the surface of the sample 208. The macro collimator 270 applies a macroscopic collimation to the beam. The macro collimator 270 may thus act on all of the beam rather than comprising an array of collimator elements that are each configured to act on a different individual portion of the beam. The macro collimator 270 may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator 270 may use a combination of magnetic and electrostatic lenses.

In another arrangement (not shown), the macro collimator 270 may be partially or wholly replaced by a collimator element array provided down-beam of the sub-beam forming array. Each collimator element collimates a respective sub-beam. The collimator element array may be formed using MEMS manufacturing techniques so as to be spatially compact. The collimator element array may be the first deflecting or focusing electron-optical array element in the beam path down-beam of the source 201. The collimator element array may be up beam of the control lens array 250. The collimator element array may be in the same module as the control lens array 250.

As shown in FIG. 4, in some embodiments, the electron-optical device 41 comprises an objective lens array 241. The objective lens array 241 comprises a plurality of objective lenses. The objective lens array 241 may be an exchangeable module. The exchangeable module may feature other electron-optical elements such as a detector array and/or a control lens array.

Below (i.e. down beam or further from the electron source 201) the macro collimator 270 there is a control lens array 250. The control lens array 250 is configured to apply a focusing action to the sub-beams prior to the sub-beams reaching the objective lens array. The pre-focusing may reduce divergence of the sub-beams or increase a rate of convergence of the sub-beams. The control lens array 250 and the objective lens array 241 operate together to provide a combined focal length. Combined operation without an intermediate focus may reduce the risk of aberrations. Additionally or alternatively, the control lenses in the control lens array 250 are configured to control the opening angle of the sub-beams and/or to control demagnification (i.e. magnification) of the sub-beams and/or to control landing energy.

The control lens array 250 may be as described above in relation to FIG. 3. The control lens array 250 may be considered as one or more electrodes additional to the electrodes of the objective lens array 241. The control lens array 250 provides extra degrees of freedom for controlling the sub-beams. A greater number of electrodes comprised in the control lens array 250 provides a greater number of degrees of freedom. For example, these extra electrodes may permit landing energy and/or magnification control independent of the field strength of the objective lens array 241. In some designs the control lens may thus be part of the objective lens. Reference to such electrodes may thus be as part of the objective lens rather than a separate lens such as a control lens.

The control lens array 250 comprises a control lens for each sub-beam 211, 212, 213. A function of the control lens array 250 is to optimize the beam opening angle with respect to the demagnification of the beam and/or to control the beam energy delivered to the objective lens array 241 which directs the sub-beams 211, 212, 213 onto the sample 208. The objective lens array 241 may be positioned at or near the base of the electron-optical device 41. The control lens array 250 is preferred for optimizing a sub-beam up-beam of the objective lens array 241.

In the example of FIG. 4 a macro scan deflector 265 is provided to cause sub-beams to be scanned over the sample 208. The macro scan deflector 265 deflects respective portions of the beam to cause the sub-beams to be scanned over the sample 208. In some embodiments, the macro scan deflector 265 comprises a macroscopic multi-pole deflector, for example with eight poles or more. The deflection is such as to cause sub-beams derived from the beam to be scanned across the sample 208 in one direction (e.g. parallel to a single axis, such as an X axis) or in two directions (e.g. relative to two non-parallel axes, such as X and Y axes). The macro scan deflector 265 acts macroscopically on all of the beam rather than comprising an array of deflector elements that are each configured to act on a different individual portion of the beam. In the example shown, the macro scan deflector 265 is provided between the macro collimator 270 and the control lens array 250.

In another arrangement (not shown), the macro scan deflector 265 may be partially or wholly replaced by a scan deflector array. The scan deflector array comprises a plurality of scan deflectors. The scan deflector array may be formed using MEMS manufacturing techniques. Each scan deflector scans a respective sub-beam over the sample 208. The scan-deflector array may thus comprise a scan deflector for each sub-beam. Each scan deflector may deflect the sub-beam in one direction (e.g. parallel to a single axis, such as an X axis) or in two directions (e.g. relative to two non-parallel axes, such as X and Y axes). The deflection is such as to cause the sub-beam to be scanned across the sample 208 in the one or two directions (i.e. one dimensionally or two dimensionally). The scan deflector array may be up beam of an objective lens array 241. The scan deflector array may be down beam of a control lens array 250. Although reference is made to a single sub-beam associated with a scan deflector, groups of sub-beams may be associated with a scan deflector. In some embodiments, the scanning deflectors described in EP2425444, which document is hereby incorporated by reference in its entirety specifically in relation to scan deflectors, may be used to implement the scan-deflector array. A scan-deflector array (e.g. formed using MEMS manufacturing techniques as mentioned above) may be more spatially compact than a macro scan deflector. The scan deflector array may be in the same module as the objective lens array 241.

In other embodiments both a macro scan deflector 265 and the scan-deflector array are provided. In such an arrangement, the scanning of the sub-beams over the sample surface may be achieved by controlling the macro scan deflector and the scan-deflector array together, preferably in synchronization.

In some embodiments, the electron-optical device 41 further comprises a sub-beam forming array 252. The sub-beam forming array 252 defines an array of beam-limiting apertures. The sub-beam forming array 252 may be referred to as an upper beam-limiting aperture array or up-beam beam-limiting aperture array. The sub-beam forming array 252 may comprise a plate (which may be a plate-like body) having a plurality of apertures. The sub-beam forming array 252 forms sub-beams from a beam of electrons emitted by the source 201. Portions of the beam other than those contributing to forming the sub-beams may be blocked (e.g. absorbed) by the sub-beam forming array 252 so as not to interfere with the sub-beams down-beam. The sub-beam forming array 252 may be referred to as a sub-beam defining aperture array or an upper beam limiter. The apertures of the sub-beam forming array 252 may have a diameter 72 (see FIG. 12) of at least 20 μm, optionally at least 50 μm, optionally at least 100 μm, and optionally 120 μm. The apertures have a pitch that may by equal to that of the apertures of the beam apertures 406.

In some embodiments, as exemplified in FIG. 4, the electron-optical device 41 is an objective lens array assembly (which is a unit that comprises the objective lens array 241) and comprises a beam shaping aperture array 262 (or beam shaping array). The beam shaping array 262 defines an array of beam-limiting apertures. The beam shaping array 262 may be referred to as a lower beam limiter, lower beam-limiting aperture array or final beam-limiting aperture array. The beam shaping array 262 may comprise a plate (which may be a plate-like body) having a plurality of apertures. The beam shaping array 262 may be down-beam from at least one electrode (optionally from all electrodes) of the control lens array 250. In some embodiments, the beam shaping array 262 is down-beam from at least one electrode (optionally from all electrodes) of the objective lens array 241.

In an arrangement, the beam shaping array 262 is structurally integrated with an electrode of the objective lens array 241. Desirably, the beam shaping array 262 is positioned in a region of low electrostatic field strength. Each of the beam-limiting apertures is aligned with a corresponding objective lens in the objective lens array 241. The alignment is such that a portion of a sub-beam from the corresponding objective lens can pass through the beam-limiting aperture and impinge onto the sample 208. Each beam-limiting aperture has a beam limiting effect, allowing only a selected portion of the sub-beam incident onto the beam shaping array 262 to pass through the beam-limiting aperture. The selected portion may be such that only a portion of the respective sub-beam passing through a central portion of respective apertures in the objective lens array reaches the sample. The central portion may have a circular cross-section and/or be centered on a beam axis of the sub-beam.

Figures 7, 8:
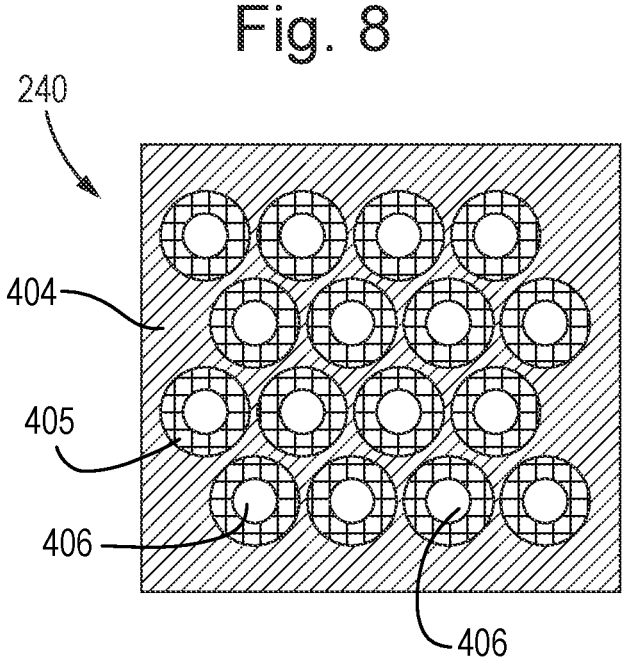
FIG. 7 is a schematic cross-sectional view of an objective lens array of a charged particle apparatus according to some embodiments of the present disclosure.
FIG. 8 is a bottom view of a modification of the objective lens array of FIG. 7.

Any of the electron apparatuses 40 described herein may further comprise a detector 240. The detector 240 detects electrons emitted from the sample 208. The detected electrons may include any of the electrons detected by an SEM, including secondary and/or backscattered electrons emitted from the sample 208. An exemplary construction of a detector 240 is shown in FIG. 7 and described in more detail below with reference to FIGS. 8-10.

Figure 5:
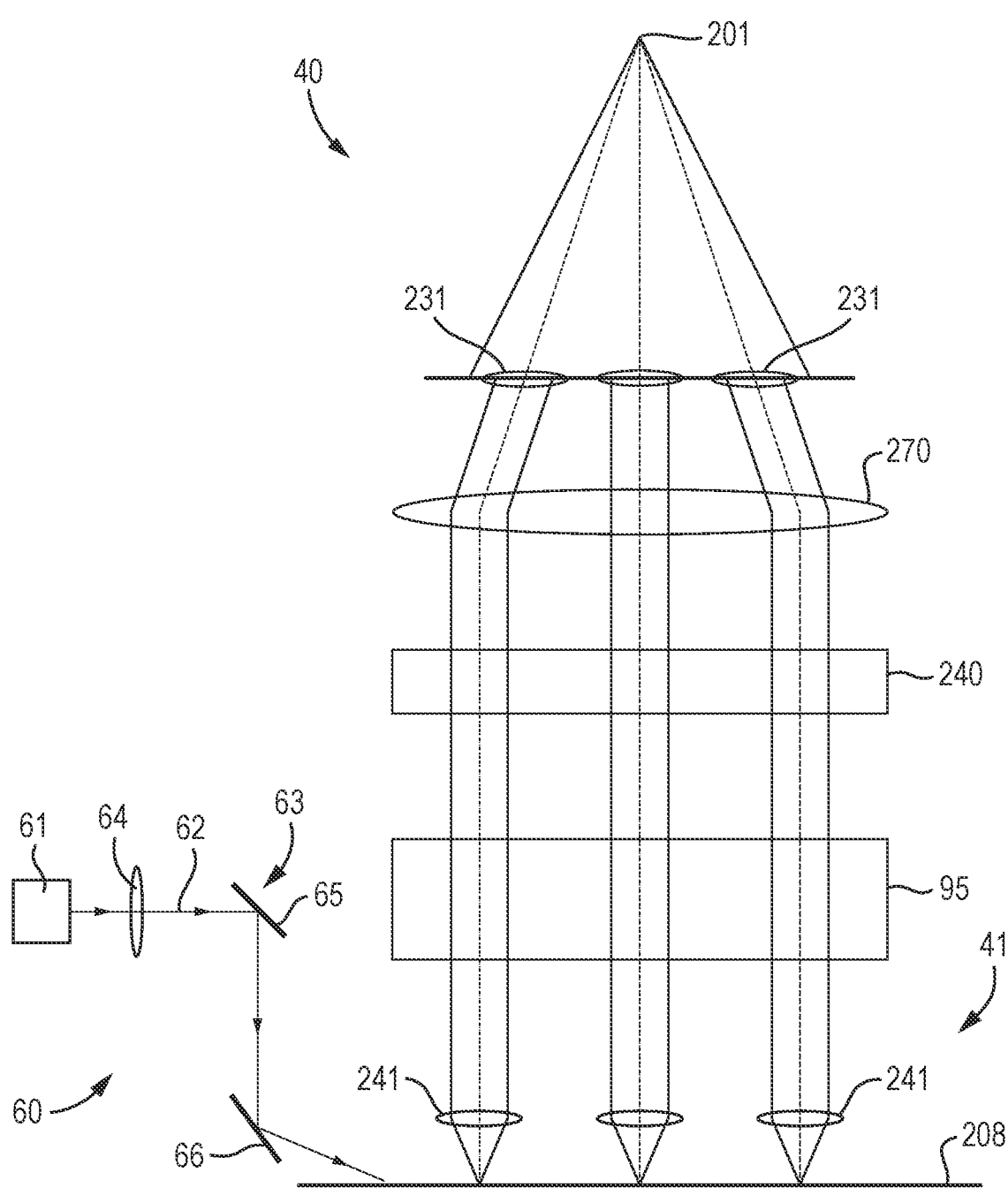
FIG. 5 is a schematic diagram of an exemplary multi-beam charged particle apparatus according to some embodiments of the present disclosure.

FIG. 5 schematically depicts an electron apparatus 40 according to some embodiments. Features that are the same as those described above are given the same reference numerals. For conciseness, such features are not described in detail with reference to FIG. 5. For example, the source 201, the macro collimator 270, the objective lens array 241 and the sample 208 may be as described above.

In some embodiments, the electron apparatus 40 comprises an array condenser lenses 231. There may be many tens, many hundreds or many thousands of condenser lenses 231. The condenser lenses 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The array of condenser lenses 231 may take the form of at least two plates, acting as electrodes, with an aperture in each plate aligned with each other and corresponding to the location of a sub-beam. At least two of the plates are maintained during operation at different potentials to achieve the desired lensing effect.

In an arrangement the array of condenser lenses 231 is formed of three plate arrays in which electrons have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

As described above, in some embodiments, the detector 240 is between the objective lens array 241 and the sample 208. The detector 240 may face the sample 208. Alternatively, as shown in FIG. 5, in some embodiments, the objective lens array 241, which comprises the plurality of objective lenses, is between the detector 240 and the sample 208.

In some embodiments, a deflector array 95 is between the detector 240 and the objective lens array 241. In some embodiments, the deflector array 95 comprises a Wien filter so that deflector array may be referred to as a beam separator. The deflector array 95 is configured to provide a magnetic field to disentangle the electrons projected to the sample 208 from the secondary electrons from the sample 208.

In some embodiments, the detector 240 is configured to detect signal particles by reference to the energy of the electron, i.e. dependent on a band gap. Such a detector 240 may be called an indirect current detector. The secondary electrons emitted from the sample 208 gain energy from the fields between the electrodes. The secondary electrodes have sufficient energy once they reach the detector 240.

Figure 6:
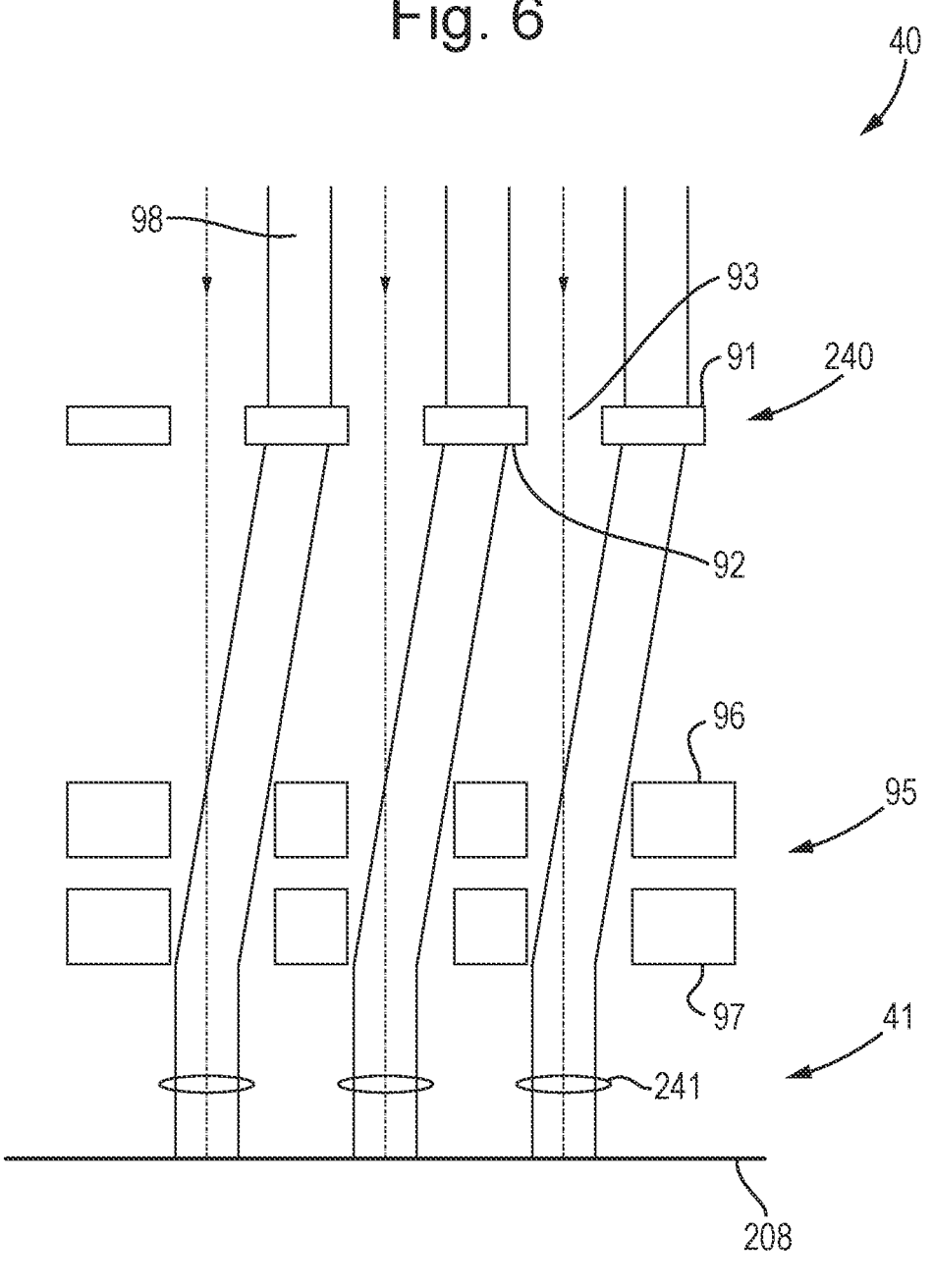
FIG. 6 is a schematic diagram of part of the multi-beam charged particle apparatus of FIG. 5.

FIG. 6 is a close-up view of part of the electron apparatus 40 shown in FIG. 5. In some embodiments, the detector 240 comprises an electron to photon converter array 91. The electron to photon converter array 91 comprises a plurality of fluorescent strips 92. Each fluorescent strip 92 is located in the plane of the electron to photon converter array 91. At least one fluorescent strip 92 is arranged between two adjacent electron beams projected towards the sample 208.

In some embodiments, the fluorescent strips 92 extend substantially in the horizontal direction. Alternatively, the electron to photon converter array 91 may comprise a plate of a fluorescent material with openings 93 for the projected electron beams.

The projected electron beams, indicated by dashed lines in FIG. 6, are projected through the plane of the electron to photon converter array 91, via the openings 93 between the fluorescent strips 92, towards the deflector array 95.

In some embodiments, the deflector array 95 comprises a magnetic deflector 96 and an electrostatic deflector 97. The electrostatic deflector 97 is configured to counteract the deflection of the magnetic deflector 96 for the projected electron beams transmitted towards the sample 208. Accordingly, the projected electron beams may be shifted to a small extent in the horizontal plane. The beams down-beam of the deflector array 95 are substantially parallel to the beams up-beam of the deflector array 95.

In some embodiments, the objective lens array 241 comprises a plurality of plates for guiding secondary electrons created in the sample 208 towards the deflector array 95. For the secondary electrons, which travel in opposite direction with respect to the projected electron beams, the electrostatic deflector 97 does not counteract the deflection of the magnetic deflector 96. Instead, the deflections of the secondary electrons by the electrostatic deflector 97 and the magnetic deflector 96 add up. Accordingly, the secondary electrons are deflected to travel at an angle with respect to the optical axis in order to transmit the secondary electrons onto the fluorescent strips 92 of the detector 240.

At the fluorescent strips 92, photons are created upon incidence of the secondary electrons. In some embodiments, the photons are transported from the fluorescent strip 92 to a photo detector (not shown) via a photon transport unit. In some embodiments, the photon transport unit comprises an array of optical fibers 98. Each optical fiber 98 comprises an end which is arranged adjacent or attached to one of the fluorescent strips 92 for coupling photons from the fluorescent strip 92 into the optical fiber 98, and another end which is arranged to project photons from the optical fiber 98 onto the photo detector.

The objective lens array 241 may comprise at least two electrodes in which are defined aperture arrays. In other words, the objective lens array comprises at least two electrodes with a plurality of holes or apertures. FIG. 7 shows electrodes 242, 243 which are part of an exemplary objective lens array 241 having respective aperture arrays 245, 246. The position of each aperture in an electrode corresponds to the position of a corresponding aperture in another electrode. The corresponding apertures operate in use on the same beam, sub-beam or group of beams in the multi-beam. In other words, corresponding apertures in the at least two electrodes are aligned with and arranged along a sub-beam path, i.e. one of the sub-beam paths 220. Thus, the electrodes are each provided with apertures through which the respective sub-beam 211, 212, 213 propagates.

The objective lens array 241 may comprise two electrodes, as shown in FIG. 7, or three electrodes, or may have more electrodes (not shown). An objective lens array 241 having only two electrodes can have lower aberration than an objective lens array 241 having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam. Such additional electrodes may be considered to form the control lens array 250. A benefit of two electrode lens over an Einzel lens is that the energy of an in-coming beam is not necessarily the same as an out-going beam. Beneficially the potential differences on such a two electrode lens array enables it to function as either an accelerating or a decelerating lens array.

Adjacent electrodes of the objective lens array 241 are spaced apart from each other along the sub-beam paths. The distance between adjacent electrodes, in which an insulating structure might be positioned as described below, is larger than the objective lens.

Preferably, each of the electrodes provided in the objective lens array 241 is a plate. The electrode may otherwise be described as a flat sheet. Preferably, each of the electrodes is planar. In other words, each of the electrodes will preferably be provided as a thin, flat plate, in the form of a plane. Of course, the electrodes are not required to be planar. For example, the electrode may bow due to the force due to the high electrostatic field. It is preferable to provide a planar electrode because this makes manufacturing of the electrodes easier as known fabrication methods can be used. Planar electrodes may also be preferable as they may provide more accurate alignment of apertures between different electrodes.

The objective lens array 241 can be configured to demagnify the electron beam by a factor greater than 10, desirably in the range of 50 to 100 or more.

A detector 240 is provided to detect secondary and/or backscattered electrons emitted from the sample 208. The detector 240 is positioned between the objective lenses 234 and the sample 208. The detector 240 may otherwise be referred to as a detector array or a sensor array, and the terms "detector" and "sensor" are used interchangeably throughout the application.

In some embodiments, the electron-optical device 41 is configured to project a beam of electrons towards the sample 208. The electron-optical device 41 may comprise the objective lens array 241. The electron-optical device 41 may comprise the detector 240. The array of objective lenses (i.e. the objective lens array 241) may correspond with the array of detectors (i.e. the detector 240) and/or any of the beams (i.e. the sub-beams).

An exemplary detector 240 is described below. However, any reference to the detector 240 could be a single detector (i.e. at least one detector) or multiple detectors as appropriate. The detector 240 may comprise detector elements 405 (e.g. sensor elements such as capture electrodes). The detector 240 may comprise any appropriate type of detector. For example, capture electrodes for example to detect directly electron charge, scintillators or PIN elements can be used. The detector 240 may be a direct current detector or an indirect current detector. The detector 240 may be a detector as described below in relation to FIGS. 8-10.

The detector 240 may be positioned between the objective lens array 241 and the sample 208. The detector 240 is configured to be proximate the sample 208. The detector 240 may be very close to the sample 208. Alternatively, there may be a larger gap between, the detector 240 and the sample 208. The detector 240 may be positioned in the device so as to face the sample 208. Alternatively, the detector 240 may be positioned elsewhere in the electron-optical device 41 such that part of the electron-optical device that faces the sample 208 is other than, and thus is not, a detector. For example the detector 240 may have a part at least associated with an electrode of the objective lens array 241.

For a multi-beam system of the type shown in FIGS. 2-5, preferably, a distance between the electron-optical column and the sample 208 is less than or equal to approximately 50 μm. The distance is determined as the distance from a surface of the sample 208 facing the electron-optical column and a surface of the electron-optical column facing the sample 208.

FIG. 8 is a bottom view of the detector 240 which comprises a substrate 404 on which are provided a plurality of detector elements 405 each surrounding a beam aperture 406. The beam apertures 406 may be formed by etching through the substrate 404. In the arrangement shown in FIG. 8, the beam apertures 406 are in a hexagonal close packed array. The beam apertures 406 can also be differently arranged, e.g. in a rectangular array. The beam arrangement of the hexagonal arrangement in FIG. 8 may be more densely packed than a square beam arrangement. The detector elements 405 may be arranged in a rectangular array or a hexagonal array.

In some embodiments, the beam apertures 406 have a pitch P of at least 50 μm, optionally at least 100 μm, optionally at least 200 μm and optionally 210 μm. A greater pitch allows for the diameter d of the beam apertures 406 to be greater. In some embodiments, the beam apertures 406 have a pitch P of at most 1000 μm, optionally at most 500 μm, and optionally at most 250 μm. The pitch of the beam apertures 406 defines the pitch of the sub-beams of the electron multi-beam that is projected toward the sample 208. In some embodiments, the sub-beams of the electron multi-beam have a pitch of at least 50 μm, optionally at least 100 μm, optionally at least 200 μm and optionally 210 μm. In some embodiments, the beam apertures 406 have a diameter d that is less than the pitch P. In some embodiments, the beam apertures 406 have a diameter d that is at least 10 μm, and optionally at least 20 μm. In some embodiments, the beam apertures 406 have a diameter d that is at most 100 μm, optionally at most 50 μm, and optionally at most 30 μm. A smaller diameter d improves the resolution such that smaller defects can be detected.

Figure 9:
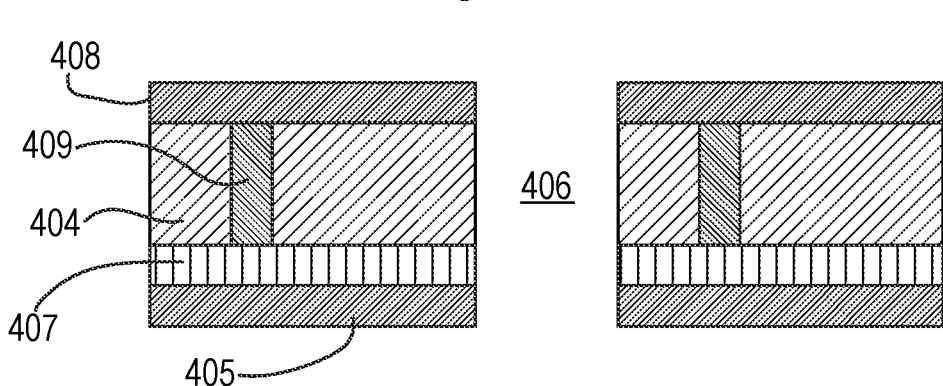
FIG. 9 is an enlarged schematic cross-sectional view of a detector incorporated in the objective lens array of FIG. 7.

FIG. 9 depicts at a larger scale a part of the detector 240 in cross section. The detector elements 405 form the bottommost, i.e. most close to the sample 208, surface of the detector 240. Between the detector elements 405 and the main body of the substrate 404 a logic layer 407 may be provided. At least part of the signal processing system may be incorporated into the logic layer 407.

A wiring layer 408 is provided on the backside of, or within, the substrate 404 and connected to the logic layer 407 by through-substrate vias 409. The number of through-substrate vias 409 need not be the same as the number of beam apertures 406. In particular if the electrode signals are digitized in the logic layer 407 only a small number of through-silicon vias may be required to provide a data bus. The wiring layer 408 can include control lines, data lines and power lines. It will be noted that in spite of the beam apertures 406 there is ample space for all necessary connections. The detection module 402 can also be fabricated using bipolar or other manufacturing techniques. A printed circuit board and/or other semiconductor chips may be provided on the backside of detector 240.

The integrated detector array described above is particularly advantageous when used with a tool having tunable landing energy as secondary electron capture can be optimized for a range of landing energies.

The detector 240 may be implemented by integrating a CMOS chip detector into a bottom electrode of the objective lens array 241. Integration of a detector 240 into the objective lens array 241 or other component of the electron-optical device 41 allows for the detection of electrons emitted in relation to multiple respective sub-beams. The CMOS chip is preferably orientated to face the sample (because of the small distance (e.g. 50 μm or less) between the sample and a bottom of the electron-optical column). In some embodiments, detector elements 405 to capture the secondary electrons are formed in the surface metal layer of the CMOS device. The detector elements 405 can be formed in other layers. Power and control signals of the CMOS may be connected to the CMOS by through-silicon vias. For robustness, preferably a passive silicon substrate with holes shields the CMOS chip from high E-fields.

In order to maximize the detection efficiency it is desirable to make the surface of the detector elements 405 as large as possible, so that substantially all the area of the objective lens array 241 (excepting the apertures) is occupied by detector elements 405. Additionally or alternatively, each detector element 405 has a diameter substantially equal to the array pitch (i.e. the aperture array pitch described above in relation to the electrodes of the objective lens assembly 241). Therefore, the diameter of each detector element may be less than approximately 600 μm, and preferably between approximately 50 μm and 500 μm. As described above, the pitch may be selected depending on the intended distance between the sample 208 and the detector 240. In some embodiments, the outer shape of the detector element 405 is a circle, but this can be made a square to maximize the detection area. Also the diameter of the through-substrate via 409 can be minimized. A typical size of the electron beam is in the order of 5 to 15 micron.

In some embodiments, a single detector element 405 surrounds each beam aperture 406. In another example, a plurality of detector elements 405 are provided around each beam aperture 406. The electrons captured by the detector elements 405 surrounding one beam aperture 406 may be combined into a single signal or used to generate independent signals. The detector elements 405 may be divided radially. The detector elements 405 may form a plurality of concentric annuluses or rings. The detector elements 405 may be divided angularly. The detector elements 405 may form a plurality of sector-like pieces or segments. The segments may be of similar angular size and/or similar area. The electrode elements may be separated both radially and angularly or in any other convenient manner.

However a larger surface for the detector elements 405 leads to a larger parasitic capacitance, so a lower bandwidth. For this reason it may be desirable to limit the outer diameter of the detector elements 405. Especially in case a larger detector element 405 gives only a slightly larger detection efficiency, but a significantly larger capacitance. A circular (annular) detector element 405 may provide a good compromise between collection efficiency and parasitic capacitance.

A larger outer diameter of the detector element 405 may also lead to a larger crosstalk (sensitivity to the signal of a neighboring hole). This can also be a reason to make the outer diameter of the detector element 405 smaller. Especially in case a larger detector element 405 gives only a slightly larger detection efficiency, but a significantly larger crosstalk.

The electron current collected by detector element 405 is amplified, for example by an amplifier such as a TIA.

In some embodiments, the objective lens array 241 is an exchangeable module, either on its own or in combination with other elements such as the control lens array 250 and/or the detector 240 and/or the beam shaping array 262 and/or the sub-beam forming array 252. The exchangeable module may be field replaceable, i.e. the module can be swapped for a new module by a field engineer. In some embodiments, multiple exchangeable modules are contained within the tool and can be swapped between operable and non-operable positions without opening the electron apparatus 40.

In some embodiments, the exchangeable module comprises an electron-optical component, and specifically may be the electron-optical device, which is on a stage permitting actuation for positioning of the component. In some embodiments, the exchangeable module comprises a stage. In an arrangement the stage and the exchangeable module may be an integral part of the tool 40. In an arrangement the exchangeable module is limited to the stage and the device, such as the electron-optical device, it supports. In an arrangement the stage is removable. In an alternative design the exchangeable module comprising the stage is removable. The part of the electron apparatus 40 for the exchangeable module is isolatable, that is the part of the electron apparatus 40 is defined by a valve up-beam and a valve down-beam of the exchangeable module. The valves can be operated to isolate the environment between the valves from the vacuum up-beam and down-beam of the valves respectively enabling the exchangeable module to be removed from the electron apparatus 40 whilst maintaining the vacuum up-beam and down-beam of the part of the electron apparatus 40 associated with the exchangeable module. In some embodiments, the exchangeable module comprises a stage. The stage is configured to support a device, such as the electron-optical device, relative to the beam path. In some embodiments, the module comprises one or more actuators. The actuators are associated with the stage. The actuators are configured to move the device relative to the beam path. Such actuation may be used to align the device and the beam path with respect to each other.

In some embodiments, the exchangeable module is a microelectromechanical systems (MEMS) module. MEMS are miniaturized mechanical and electromechanical elements that are made using microfabrication techniques. In some embodiments, the exchangeable module is configured to be replaceable within the electron apparatus 40. In some embodiments, the exchangeable module is configured to be field replaceable. Field replaceable is intended to mean that the module may be removed and replaced with the same or different module while maintaining the vacuum in which the electron-optical tool 40 is located. Only a section of the electron apparatus 40 is vented corresponding to the module is vented for the module to be removed and returned or replaced.

The control lens array 250 may be in the same module as an objective lens array 241, i.e. forming an objective lens array assembly or objective lens arrangement, or it may be in a separate module In some embodiments, one or more aberration correctors are provided that reduce one or more aberrations in the sub-beams. The one or more aberration correctors may be provided in any of the embodiments, e.g. as part of the electron-optical device, and/or as part of an optical lens array assembly, and/or as part of an assessment system. In some embodiments, each of at least a subset of the aberration correctors is positioned in, or directly adjacent to, a respective one of the intermediate foci (e.g. in or adjacent to the intermediate image plane). The sub-beams have a smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In some embodiments, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each sub-beam and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses 231 (e.g. with each such aberration corrector being integrated with, or directly adjacent to, one or more of the condenser lenses 231). This is desirable because at or near the condenser lenses 231 aberrations will not yet have led to a shift of corresponding sub-beams because the condenser lenses are vertically close or coincident with the beam apertures. A challenge with positioning correctors at or near the condenser lenses, however, is that the sub-beams each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, the objective lens array 241. In some embodiments, these aberration correctors reduce one or more of the following: field curvature; focus error; and astigmatism. Additionally or alternatively, one or more scanning deflectors (not shown) may be integrated with, or directly adjacent to, the objective lens array 241 for scanning the sub-beams 211, 212, 213 over the sample 208. In some embodiments, the scanning deflectors described in US 2010/0276606, which document is hereby incorporated by reference in its entirety, may be used.

The detector may be provided with multiple portions and more specifically, multiple detecting portions. The detector comprising multiple portions may be associated with one of the sub-beams 211, 212, 213. Thus, the multiple portions of one detector 240 may be configured to detect signal particles emitted from the sample 208 in relation to one of the primary beams (which may otherwise be referred to as sub-beams 211, 212, 213). In other words, the detector comprising multiple portions may be associated with one of the apertures in at least one of the electrodes of the objective lens assembly. More specifically, the detector 405 comprising multiple portions may be arranged around a single aperture 406 as shown in FIG. 10, which provides an example of such a detector.

Figure 10:
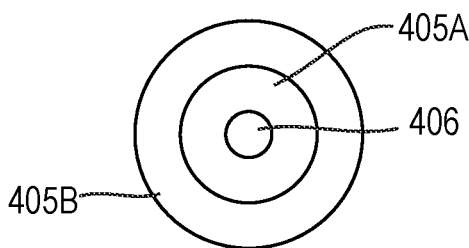
FIG. 10 is a bottom view of a detector element of a detector.

As shown in FIG. 10, the detector element 405, in which an aperture 406 is defined and configured for the through passage of an electron beam, comprises an inner detecting portion 405A and an outer detecting portion 405B. The inner detecting portion 405A surrounds the aperture 406 of the detector. The outer detecting portion 405B is radially outwards of the inner detecting portion 405A. The shape of the detector may be generally circular. Thus, the inner detecting portion and the outer detecting portion may be concentric rings.

The embodiments of the present disclosure can be applied to various different tool architectures. For example, the electron apparatus 40 may comprise a plurality of electron-optical columns of multi-beams. The electron-optical columns may comprise the electron-optical device 41 described in any of the above embodiments or aspects. As a plurality of electron-optical columns (or a multi-column tool), the devices may be arranged in an array which may number two to one hundred electron-optical columns or more. The electron apparatus 40 may take the form of an example as described with respect to and depicted in FIG. 4 or as described with respect to and depicted in FIG. 5. An electron-optical column may optionally comprise a source.

As mentioned above, to increase contrast for electron beam inspection the surface of the sample 208 can be illuminated with light prior to the inspection of the sample 208. This process may be called advanced charge control. Such illumination may excite electrons within the sample 208. Such excited electrons within a sample 208 are more likely to interact with impinging electrons from incidental primary sub-beams of the multi-beam. Consequently, such illumination may be used to improve the strength of the signal particle signal. The optical illumination may improve contrast of the detected signal.

Figure 11:
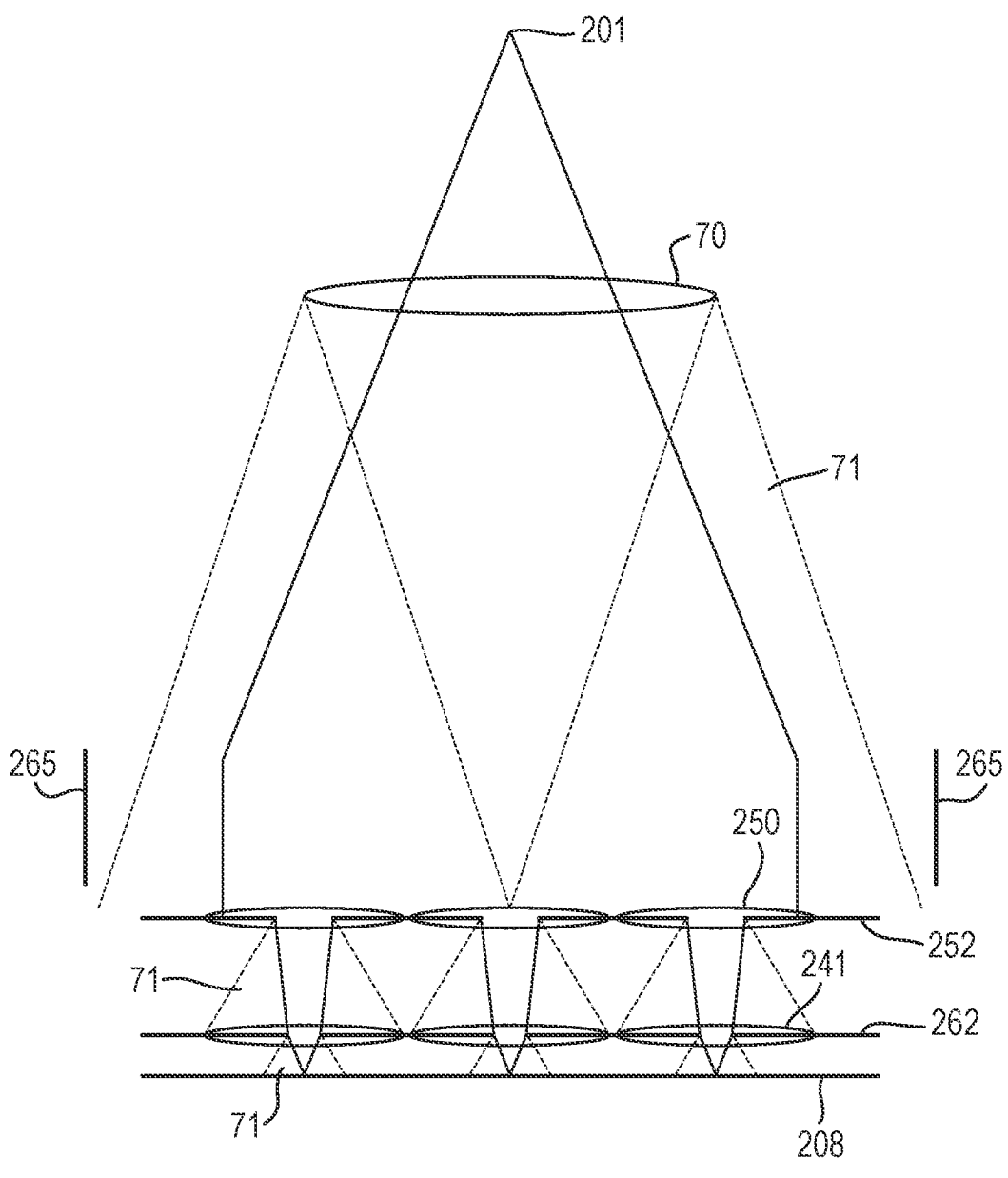
FIG. 11 is a schematic diagram of the exemplary electron apparatus according to some embodiments of the present disclosure.

FIG. 11 is a schematic view of an electron apparatus 40 according to some embodiments. The electron apparatus 40 is configured to project the electron multi-beam toward the sample 208. As shown in FIG. 11, in some embodiments, the electron apparatus 40 comprises an electron source 201. The electron source 201 is configured to emit an electron beam. The electron source may be as described above.

Figure 13:
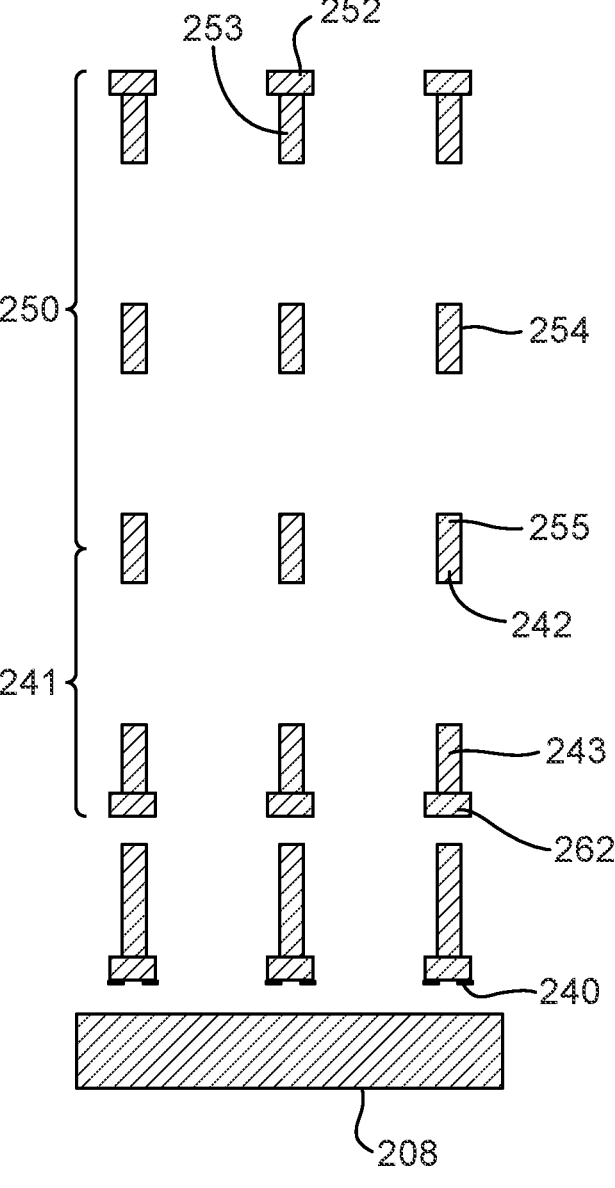
FIG. 13 is a schematic cross-sectional view of a control lens array and an objective lens array of a charged particle apparatus according to some embodiments of the present disclosure.

In some embodiments, the electron apparatus 40 comprises an electron-optical device 41. The electron-optical device 41 is configured to project toward the sample 208 sub-beams of an electron multi-beam derived from the electron beam emitted by the electron source 201. The electron-optical device 41 may comprise one or more electron-optical elements configured to act on the electron multi-beam. For example, in the arrangement shown in FIG. 11, the electron-optical device 41 may comprise the sub-beam forming array 252, the control lens array 250, the objective lens array 241 and the beam shaping array 262. In some embodiments, the control lens array 250 comprises at least two plates in which a plurality of apertures is defined, each aperture for a sub-beam of the multi-beam. In some embodiments, the objective lens array 241 comprises at least two plates in which a plurality of apertures is defined, each aperture for a sub-beam of the multi-beam. In some embodiments, the electron-optical device 41 further comprises the macro scan deflector 265 and the macro collimator 270 (e.g. as described above with reference to FIG. 4). Alternatively, the macro scan deflector 265 may be a separate component from the electron-optical device 41, or the macro collimator 270 may be a separate component from the electron optical device 41, or both. Although not shown in FIG. 11, the electron-optical device 41 may further comprise the detector 240. This is illustrated in FIG. 13. The electron-optical device 41 may have the features described above in relation to drawings other than FIG. 11.

As shown in FIG. 11, in some embodiments, the electron apparatus 40 comprises a light source 70. The light source 70 is configured to emit light 71 (i.e. photons). In some embodiments, the light source 70 is configured to emit light 71 generally toward the sample 208. The light 71 is for irradiating the surface of the sample 208 so as to improve contrast when inspecting the sample 208 for defects.

As shown in FIG. 11, in some embodiments, the light source 70 is arranged such that the light 71 is projected along paths of the sub-beams through the electron-optical device 41 (for example along as light paths) so as to irradiate at least a portion of the sample 208. In some embodiments, the portion of the sample 208 irradiated by the light 71 corresponds to a portion that subsequently receives an electron beam. The light 71 is projected through the objective lens array 241 of the electron apparatus 40. The electron apparatus 40 is configured to project the light 71 onto the surface of the sample 208 from above the electron-optical device 41.

In some embodiments, the paths of the light 71 (or the light paths) through apertures of electron-optical elements of the electron-optical device 41 are substantially straight. In some embodiments, apertures of electron-optical elements of the electron-optical device 41 are aligned such that the paths along which the light 71 is projected (or the light paths) are substantially straight.

By providing the light 71 through the electron-optical device 41, it is not necessary to provide a separate projection system 60 for projecting light 71, for example as one or more light beams, onto the sample 208. The projection system 60 shown in, for example, FIG. 2 may be omitted. At least some embodiments of the present disclosure are expected to simplify the design of the electron apparatus 40.

The complex optical arrangement to direct light between the sample 208 and the surface of the electron-optical device 41 so at illuminate the sample surface can be omitted. As mentioned above, the gap between the electron-optical column and the surface of the sample 208 may be small. This can make it difficult to project the light 71 onto the sample 208 from the side, for example using the projection system 60 shown in FIG. 2. In particular it can be difficult to irradiate the light 71 over the full width of the electron-optical column. At least some embodiments of the present disclosure are expected to make it easier to irradiate light 71 over the breadth of sub-beams used for inspection.

As described above, the electron-optical device 41 may comprise various electron-optical elements. In some embodiments, the electron apparatus 40 comprises at least two electron-optical elements comprising respective array of apertures. The apertures of the respective arrays of apertures of the respective electron-optical elements correspond to respective sub-beams of the electron multi-beam. (Thus the electron apparatus comprises at least one electron-optical element comprising a respective array of apertures. The apertures of the respective arrays of apertures of the respective one or more electron-optical elements correspond to respective sub-beams of the electron multi-beam). The light source 70 is arranged relative to the electron-optical elements such that the light or light beams 71 follow the same paths to the sample 208 as the electron-multi-beam for example through an electron-optical element; that is the light paths and the electron beam (or sub-beam) paths may follow substantially the same paths.

As shown in FIG. 11, in some embodiments, the light source 70 is adjacent to the electron source 201. The light source 70 may be provided at a similar distance from the sample 208 (e.g. height) as the electron source 201. The distance from the electron source 201 to the sample 208 may be similar (e.g. within 10% difference) to the distance from the sample 208 to the light source 70. In some embodiments, the light source 70 is proximate to the electron source 201. The light source 70 may be positioned so that the lengths of the paths to the sample 208 for the light or light beam 71 (or the light paths) are similar to the lengths of the paths to the sample 208 for the electrons of the electron sub-beams, for example incident on the sample 208. By providing the light source 70 near the electron source 201, the electron apparatus 40 may be formed more compactly.

As shown in FIG. 11, in some embodiments, the light source 70 is arranged such that the electron source 201, for example the path of the electron beam from the source 201 toward the sample in an electron beam, in plan view, is radially inward of the light or light beam 71 up-beam of the electron-optical device 41. For example, at a position along the charged particle beam that is up-beam of the electron-optical device 41, electron beam, in plan view, is radially inward of the light or light beam 71. The light source 70 and the electron source 201 are up-beam of the electron-optical device 41. The electron-optical device 41 is between the sample 208 and the light source 70 and electron source 201. Plan view means the view looking along the primary axis of the electron apparatus 40 and/or along the electron and/or light beam paths towards the sample 208 for example on the surface of the sample 208 where the electron and/or light beams impact the sample 208.

As shown in FIG. 11, in some embodiments, the electron source 201 is arranged such that the electron beam may be aligned with a central axis of the electron-optical device 41. That is the path of the electron beam towards the sample 208 may be aligned with the central axis of the electron-optical device 41. The electron beam, from which the electron multi-beam is derived, is unaffected by the light source 70.

As shown in FIG. 11, in some embodiments, the light source 70 is located between at least part of the electron source 201 and the sample 208. The electron source 201 may comprise an emitter (e.g. a cathode) and an extractor electrode (e.g. an anode). The light source 70 may be located between the sample 208 and the emitter and extractor of the electron source 201; the sample 208 may be positioned closer, i.e. with smaller displacement, from the emitter and extractor of the electron source 201. The light source 70 is unhindered by the electron source 201. That is, the light source 70 and the electron source 201 both require a clear path down-beam for example towards the sample 208. The light source 70 and the electron source 201 should be physically separate, for example so that the volume required does not overlap. So not only that the light source 70 is unhindered by the electron sources 201, but that each source is unhindered by the other, namely they have their own volume and there is a clear path from each source towards the sample. In requiring a clear path the respective light beam is unhindered by the electron source 201; the electron beam from the electron source 201 is unhindered by the light source 70.

As described in more detail with reference to FIG. 14, in some embodiments, the electron source 201 may further comprise an electron-optical deflector 290. In some embodiments, the light source 70 is located between the sample 208 and the emitter and extractor of the electron source 201. For example the light source 70 is positioned closer to the sample than emitter and extractor of the electron source 201. The distance from the sample 208 to the light source 70 may be smaller than the distance from the sample 208 to the electron source 201, for example along the path of the electron beam from the electron source 201 towards the sample 208. In such an arrangement, the electron-optical deflector 290 (or electrostatic deflector pair configured to operate on the electron beam from the electron source 201) is located between the sample 208 and the light source 70 for example along the path of the electron beam from the electron source 201 to the sample 208. The deflector 290 may be positioned at a smaller distance from the sample 208 than the light source 70, for example along the path of a light beam (or the light path) from the light source 70 to the sample 208. Alternatively, in some embodiments, the light source 70 is located, in the axial direction (i.e. the direction perpendicular to the surface of the sample 208), between the sample 208 and the emitter, extractor and electron-optical deflector 290 of the electron source 201.

In some embodiments, the electron source 201 is located, in the axial direction, between the light source 70 and the sample 208. In some embodiments, the light source 70 is offset from the central axis of the electron-optical device 41. By providing that the light source 70 is offset from the axis, the light source 70 is unhindered by the electron source 201.

In some embodiments, the light source 70 is located at at least two positions spaced from, in plan view, the electron beam. That is either different parts of the light source 70 are located at the different positions or the light source 70 extends between the different positions; the different positions are spaced part from the path of the electron beam viewed along, for example the path of the electron beam towards the sample 208. The light source 70 may be configured to emit light 71 comprising a plurality of light beams. The light beams may be emitted from a plurality of points of the light source 70. The light source 70 may be distributed over a plurality of positions from which light 71 is emitted. In some embodiments, the controller 50 is configured to control the light source 70 so that light 71 is controllably emitted from the plurality of positions simultaneously.

By distributing the light source 70 over a plurality of positions, the light source 70 may be symmetrical about the central axis while avoiding mechanical interference between the light source 70 and the electron source 201. In some embodiments, the light source 70 is arranged such that the light 71 comprises a plurality of light beams (or the light paths) and the path of the electron beam is between the plurality of light beams up-beam of the electron-optical device 41.

There are various possible arrangement for the distributed light source 70. In some embodiments, the positions are equidistantly spaced from each other. Additionally or alternatively, the positions are at a similar radial distance from the electron source 201. At least some embodiments of the present disclosure are expected to make it easier to apply a consistent level of light irradiation over the lateral dimension of the sample 208.

As shown in FIG. 11, in some embodiments, the positions surround, in plan view, the electron source 201. As further shown in FIG. 11, in some embodiments, the positions are continuous so as to form an arc spaced from, in plan view, the electron source 201. In some embodiments, the light source 70 forms an arc which is radially distanced from the path of the electron beam emitted from the electron source 201. For example, in the arrangement shown in FIG. 11 the positions form an annulus surrounding, in plan view, the electron source 201. In some embodiments, the light source 70 forms a ring around the path of the electron beam emitted from the electron source 201. Alternatively, the are may extend partially around the path of the electron beam emitted by the electron source 201. For example, the are may correspond to half of an annulus or a quarter of an annulus. In such an arrangement, the light generated by the light source 70 may comprise a single light beam emitted from a part of the light source 70 extending over a length between two positions or even around the path or axis of the electron-optical device 41; that is the light is emitted along the continuous length between the different positions.

Figure 12:
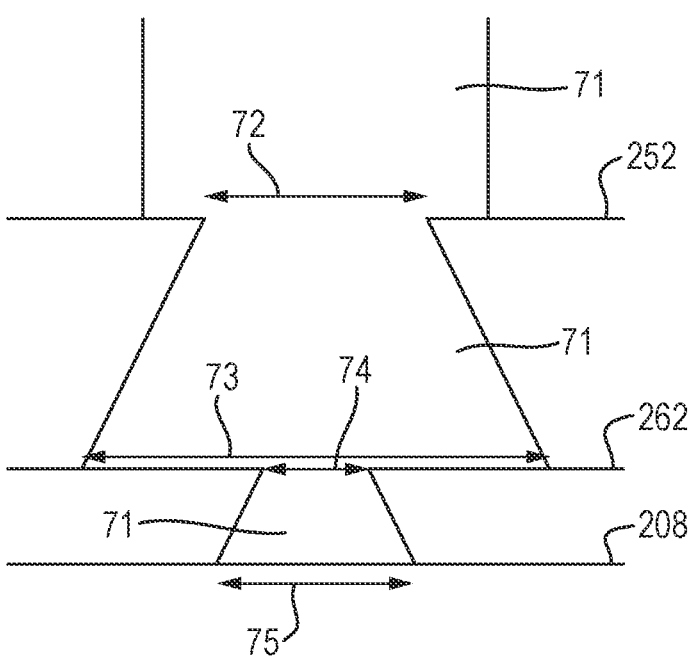
FIG. 12 is a schematic diagram of a close up view of part of the exemplary charged particle apparatus shown in FIG. 11.

FIG. 12 is a close up view of part of the electron apparatus 40 of FIG. 11. FIG. 12 shows the path of light 71 (or the light path) through only one set of apertures, i.e. corresponding to the path of one of the sub-beams of the electron multi-beam.

As shown in FIG. 12, the beam of light 71 widens when it is projected through the apertures of the sub-beam forming array 252 and the beam shaping array 262. The beam of light 71 widens due to diffraction. At the sub-beam forming array 252, the beam of light may have a diameter equal to the diameter 72 of the aperture. The beam widens to a widened diameter 73 at the beam shaping array 262. The beam shaping array 262 reduces the diameter of the beam to be substantially equal to the diameter 74 of the aperture of the beam shaping array 262.

As mentioned above, in some embodiments, the apertures of the sub-beam forming array 252 have a diameter 72 of at least 20 µm, optionally at least 50 µm, optionally at least 100 µm, and optionally 120 µm. By providing larger apertures, the beam widening due to diffraction through the aperture is reduced. This reduces the proportion of the light 71 in the light beam that is blocked at the beam shaping array 262. This increases the proportion of the light 71 that reaches the sample 208. Desirably the dimensions of the apertures of the sub-beam forming array 252 may be as large as possible so that as much of the light as possible reaches the sample when illuminating the sample with the light 71 of the light beams. In selecting the dimensions of the apertures, this requirement is balanced with the electron-optical requirements of the sub-beam forming array. Such electron-optical requirements may limit the size of the apertures so that the sub-beam forming array effectively generates the sub-beams.

In some embodiments, the apertures of the beam shaping array 262 have a diameter 74 that is greater than 10 µm, optionally at least 20 µm, and optionally at least 25 µm. By providing larger apertures, the beam widening due to diffraction through the aperture is reduced. This reduces the spot size 75 on the sample 208. Further, since the beam shaping array 262 is the smallest aperture along the path of the corresponding light beam (or the light path of the corresponding light beam), the diffractive effect on the light of the light beam is likely to be largest on passing the aperture of the beam shaping array 262. It is desirable therefore for the apertures of the beam shaping array 262 to be at east as large as a diffraction threshold. Such a diffraction threshold may be related or even determined by the wavelength of the light of the light beam. Further details of the diffraction threshold for example its relationship to the wavelength of light used is described later herein. In some embodiments, the ratio of the diameter 72 of the apertures of the sub-beam forming array 252 to the diameter 74 of the apertures of the beam shaping array 262 is at least 2, optionally at least 3, optionally at least 4 and optionally at least 5. In some embodiments, the ratio of the diameter 72 of the apertures of the sub-beam forming array 252 to the diameter 74 of the apertures of the beam shaping array 262 is at most 10, optionally at most 8, optionally at most 5 and optionally at most 4.

Additionally, the electron-optical elements along the path of the electron sub-beam in the electron-optical device 41 are generally defined by apertures of similar diameter for example to the dimension of the beaming forming array 262. Diffraction of the light beam is likely to occur on passage of a light beam through its respective apertures of the plates of the electron-optical elements. Diffraction inevitably leads to widening of the light beam along the path of the light beam (or the light path of the light beam) towards the sample surface. Such widening of the cross-section of the light beam results in a proportion of the light beam being blocked at each successive plate towards the sample, for example even if the apertures in the successive plates are substantially the same. The proportion of the light 71 that can reach the sample 208 may therefore be reduced with further additional plates along the light beam path (or light path). The proportion of the light that reaches the sample 208 may be dependent on the extent of the diffraction, for example the chosen diameter of the apertures defined in the plates and the selected wavelength for the photonic illumination. It should be noted that as certain wavelengths of the incident light in the light beam achieve a desirable excitations of electrons in the sample, the different options of the light wavelength may from a limited selection and thus from a limited choice.

It is possible that there could be an offset between the position of the electron sub-beam spot and the respective light spot on the sample 208. For example, if the light source 70 is positioned off-axis the light 71 is projected through the electron-optical device 41 at a slight angle. Any such offset is expected to be within acceptable limits. For example it can be calculated that if light source 70 is located 1 mm off-axis and the distance from the light source 70 to the beam shaping array 262 is 100 mm, then the tilt angle of the light would be about 10 mrad. The light spot may have a diameter of the order of about 30 µm and the range of the scan of the electron beam may be of the order of about 1 µm. If the distance from the beam shaping array 262 to the sample 208 is about 50 µm, then the light spot would be about 0.5 µm off-axis. If the light source is positioned about 10 mm off-axis (but with other dimensions unchanged from the above calculation), then the light spot would be about 5 µm off-axis. The distances by which the light spots are off-axis are acceptable, particularly in view of the diameter of the light spot and the scan range.

Figure 14:
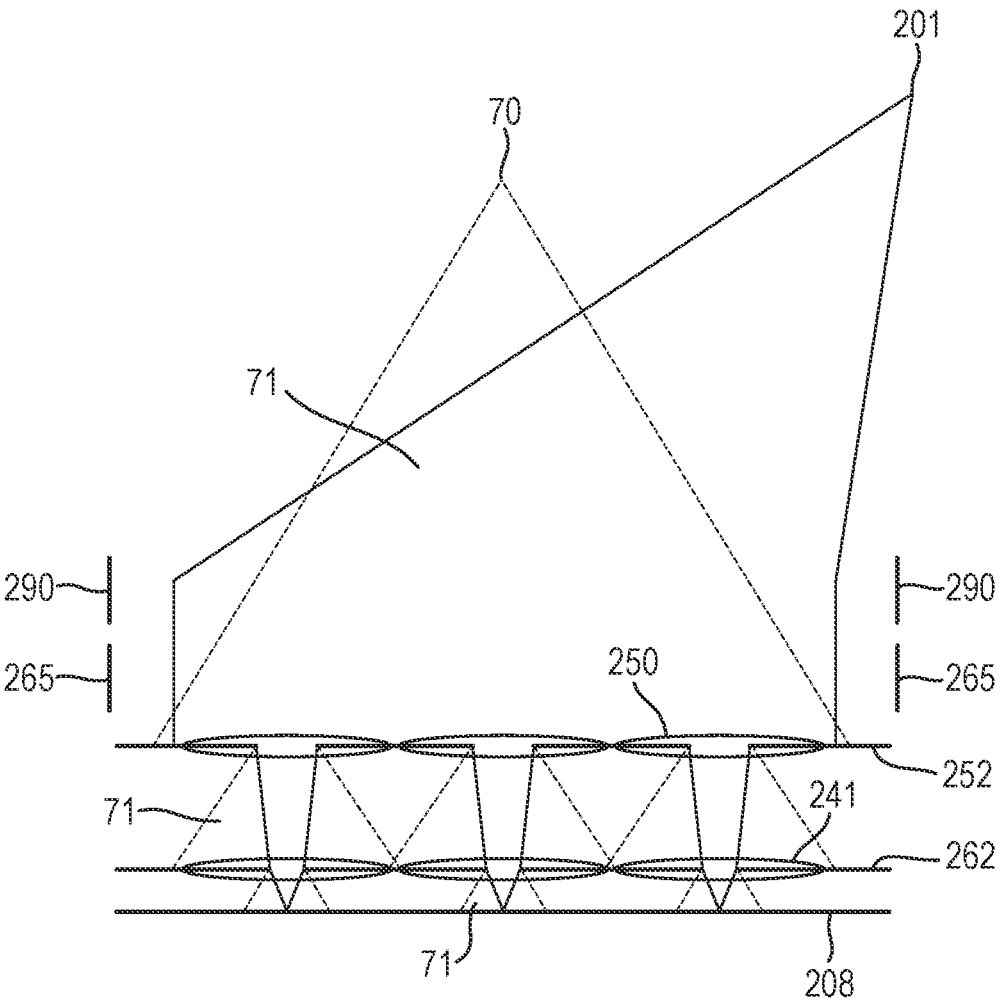
FIG. 14 is a schematic diagram of the exemplary charged particle apparatus according to some embodiments of the present disclosure.

FIG. 14 shows an alternative arrangement for the light source 70 and the electron source 201 of the electron apparatus 40. Features that are the same as described with reference to FIG. 11 are not repeated here. In some embodiments, the electron apparatus 40 further comprises the macro collimator 270, for example as described above with reference to FIG. 4. As shown in FIG. 14, in some embodiments, the light source 70 is arranged such that a path of the light 71 (or a light path) towards the sample 208 is aligned with the central axis of the electron-optical device 41. That is the path of the light beam (or the light path) from the light source 70 is aligned with the paths of the path of the electron multi-beam through the electron-optical device 41. The light source 70 may be positioned on the central axis. This can help to simplify the design of the light source 70 of the electron apparatus 40. The light source 70 may form a disk centred on the axis. This may reduce power density compared to a point light source.

As shown in FIG. 14, in some embodiments, the electron source 201 is offset from the central axis of the electron-optical device 41. For example, the electron source 201 may be located to one side of the light source 70. The path of the electron beam emitted by the electron source 201 is unaffected by the light source 70. In some embodiments, the electron source 201 may be positioned closer to, at the same distance from, or further away from, the sample 208 than light source 70.

In some embodiments, the electron source 201 is arranged to emit the electron beam to be angled relative to the central axis of the electron-optical device 41. This allows the path of the electron beam to include the central axis. The down-beam sections of the path may be aligned with the central axis. As shown in FIG. 14, in some embodiments, the electron apparatus 40 comprises an electron-optical deflector 290. The electron-optical deflector 290 is configured to deflect the electron beam to be aligned with the central axis of the electron-optical device 41. That is, down-beam of the electron-optical deflector along the electron beam from the electron source 201 towards the sample 208, the paths of the electron beam towards the sample 208 and the light beam towards the sample 208 may substantially correspond or even be the same. Although the path immediately down-beam of the emitter and extractor electrode of the electron source 201 is oblique relative to the central axis, the path down-beam of the electron-optical deflector 290 can be controlled to be aligned with the central axis or the path of the light beam (or the light path) towards the sample 208, or both (for example if the central axis of the electron-optical device 41 and the path of the light beam (or the light path) towards the sample 208 correspond.

As shown in FIG. 14, in some embodiments, the electron-optical deflector 290 is provided as a separate component from the macro scan deflector 265. The electron-optical deflector 290 may be up-beam of the macro scan deflector 265 along the path of the light beam (or the light path) and/or the path of the electron beam from the electron source 201. The electron-optical deflector 290 may be in a plane perpendicular to the central axis of the electron-optical device 41 (i.e. perpendicular to the light beam). Alternatively, the electron-optical deflector 290 may be in a plane perpendicular to the direction in which the electron beam is emitted from the electron source 201. In some embodiments, the electron-optical deflector 290 may be in a plane angled between the plane perpendicular to the central axis of the electron-optical device 41 and the plane perpendicular to the direction in which the electron beam is emitted from the electron source 201.

In some embodiments, the electron-optical deflector 290 may be a multi-pole electrostatic deflector comprising at least two electrodes that face each other for example across the path of the electron beam. It is not necessary to have the light path and the electron-optical deflector 290 orthogonal to each other because the light path is not affected by the electron-optical deflector 290. So the electron-optical deflector 290 can be tilted at any suitable angle relative to the light path; that is as long as it does not block the light path and electron beam path. An intermediate angle may be desirable to utilize symmetry of the design so as to cancel deflection aberrations. Therefore in some embodiments, the electron-optical deflector 290 may be positioned along the path of the electron beam from the electron source 201 towards the path of the light beam (or the light path) towards a sample 208 and/or the axis of the electron-optical device 41. In an arrangement the electron-optical deflector 290 may be set at any reasonable orientation for example at any angle between the path of the electron beam from the electron source 201 and the path of the light beam (or the light path) from the light source 70 towards the sample 208 and/or axis of the electron-optical device 41.

With two electrodes the deflector may deflect the path of the electron beam in one direction in a plane orthogonal to the path of the light beam (or the light path) and/or the axis of the electron-optical device 41 towards a sample 208. In some embodiments, the multipole deflector may comprise at least four electrodes for actuating the deflected electron beam in any direction orthogonal to the path of the light beam (or the light path) and/or axis of the electron-optical device 41. The multi-pole deflector may have as many electrodes as required such as two, four, six for example a multiple of four, preferably eight, twelve, sixteen, twenty, etc. In some embodiments, the macro scan deflector 265 is configured to function as the electron-optical deflector 290. The macro scan deflector 265 may be configured to deflect the electron beam to be aligned with the central axis of the electron-optical device 41. Such a macro scan deflector 265 may be a multi-pole deflector having the features described for the electron-optical deflector 290.

In some embodiments (not shown), the light source 70 is offset from the central axis of the electron-optical device 41. In such an arrangement it may be preferable for the light source 70 and the electron source 201 to be a similar distance from the sample 208, or the light source 70 to be further from the sample 208 than the electron source 201. For example, the light source 70 may be located to one side of the electron source 201. The electron source 201 may be aligned with the central axis as illustrated in FIG. 11. The light source 70 is arranged to emit the light 71 to be angled relative to the central axis of the electron-optical device 41. In an arrangement even if the light source 70 is positioned closer to the sample 208 than the electron source 201, the light beam from the light source 70 intersects the axis of the electron-optical device 41, or the path of the electron beam towards the sample 208 or both, up-beam of the first electron-optical element in the path of the electron beam from the electron source 201. The electron apparatus 40 may comprise a light reflector (e.g. a mirror). The light reflector is configured to deflect the light 71 to be aligned with the central axis of the electron-optical device 41. Although the path (or the light path) immediately down-beam of the light source 70 is oblique relative to the central axis, the path down-beam of the light reflector is aligned with the central axis. The light reflector may comprise an aperture coinciding with the central axis so as to allow the electron beam emitted by the electron source 201 to pass through it. Such a light reflector may be located up-beam of the objective lens assembly (or the objective lens array 241, the condenser lens array and/or the sub-beam forming array 252). The light reflector may be located up-beam along the path of the electron beam from the electron source 201 of at least the macro scan deflector 265, and even the macro collimator 270. In some embodiments, both the electron source 201 and the light source 70 are positioned off-axis. Both the light reflector and the electron-optical deflector 290 described above may be provided.

As shown in FIG. 11, in some embodiments, the electron-optical device 41 comprises a control lens array 250 and a beam shaping array 262 in addition to the objective lens array 241 and the beam former array 252. Additionally, the controller 50 is connected to at least the control lens array 250. The controller 50 may be considered to be at least partly comprised in the electron-optical device 41.

As shown in FIG. 11, the control lens array 250 comprises a plurality of control lenses. The control lenses are configured to adjust a charged particle-optical parameter of respective sub-beams of the electron multi-beam for example the focus of the sub-beams. The sub-beams are focused at least by respective down-beam objective lenses. For example a sub-beam may be focused by operation of the respective objective lens and control lens together.

As shown in FIG. 11, the beam shaping array 262 is down-beam of the control lens array. The beam shaping array 262, comprises a plurality of apertures for the respective sub-beams of the electron multi-beam. The beam shaping array 262 is down-beam of the sub-beam forming array 252. Thus the apertures of the beam shaping array 252 operate on sub-beams formed by the sub-beam forming array 252. In some embodiments, the apertures of the beam shaping array 262 have a diameter 74 (see FIG. 12) that is greater than 10 µm, optionally at least 20 µm, and optionally at least 25 µm.

In some embodiments, the light source 70 is configured to emit light 71 having a wavelength. For example, the light source 70 may be configured to emit light 71 having a wavelength in the range of from 450 nm to 850 nm, preferably from 450 nm to 800 nm. The selected wavelength may correspond to a wavelength absorbed by the material of the sample 208. The selected wavelength may tend to excite electrons in the sample 208 on incidence of the light with the sample 208. For example incidence of light of the selected wavelength generates electron-hole pairs in the material. The specific wavelength selected may depend on the application (for example the use or objective) of the inspection or at least assessment. In some embodiments, the apertures of the beam shaping array 262 have a dimension of at least a diffraction threshold. The diffraction threshold may be dependent on the wavelength of the light 71 that the light source 70 emits. At least some embodiments of the present disclosure are expected to reduce diffraction of the spots of light 71 on the sample 208.

The apertures in the electron-optical device 41 are small. In some embodiments, the beam shaping array 262 has the smallest apertures through which the light path extends. When the light is projected through the apertures, it is possible for there to be significant diffraction. Any such diffraction can reduce the power density of the light on the sample 208. By providing larger apertures for the beam shaping array 262, the effect of diffraction is reduced. At least some embodiments of the present disclosure are expected to increase the proportion of output power of the light source 70 that reaches the sample 208. At least some embodiments of the present disclosure are expected to reduce the output power requirement of the light source 70 while providing sufficient illumination of the sample 208.

By providing larger apertures for the beam shaping array 262, it is possible that the resolution of the electron apparatus 40 may deteriorate. It may be more difficult to detect smaller defects on the sample 208. Smaller apertures (e.g. 25-25 μm, preferably 30 μm diameter) for the beam shaping array 262 result in a lower overall electron current on the sample 208. As the size of the apertures increases, the electron current on the sample 208 increases. In general a greater total current on the sample 208 is associated with a larger minimum size of defect of the sample 208 that can be resolved. The relationship is approximately linear. In general, larger apertures increase the size of the smallest defect that can be detected. However, larger defects can be detected when larger apertures are provided for the beam shaping array 262.

In some embodiments, the controller 50 is configured to control the electron apparatus 40 so as to perform flooding of the surface of the sample 208. The flooding can be performed together with illumination using the light source 70. This can help to detect some defects in the sample 208. That is the controller 50 can control the mode of operation of the electron apparatus 40 between an assessment mode (for example an inspection mode) and a flooding mode. In a flooding mode the control lens array 250 may be used to focus the sub-beams through the apertures of the beam shaping array 262 such that the shaping of the apertures is reduced sufficiently for the current of the sub-beams incident on the sample 208 to be or exceed a threshold current. The threshold current may correspond to a minimum flooding current.

As shown in FIG. 11, in some embodiments, the electron-optical device 41 comprises the objective lens array 241. The objective lens array 241 is down-beam of the control lens array 250. The control lens array 250 is configured to adjust an electron-optical parameter of the sub-beams that are then focused by the objective lens array 241. As shown in FIG. 11 and described above, the objective lens array 241 comprises a plurality of objective lenses. The objective lenses are configured to focus respective sub-beams on the sample 208 when the sub-beams are shaped by the beam shaping array 262. The beam shaping array 262 may be associated with any electrode or plate of the objective lens array 241. In some embodiments, as depicted in FIG. 4 the beam shaping array 262 is associated, for example positioned down-beam of, the electrode of the objective lens array 241 positioned most down-beam of the path of a respective sub-beam. During flooding, the objective lenses are not required to focus the sub-beams on the surface of the sample 208.

FIG. 13 is a schematic view of part of the electron-optical device 41 of, for example, FIG. 11. FIG. 13 is a close-up view of the objective lens array 241 and the control lens array 250. As shown in FIG. 13, in some embodiments, the beam shaping array 262 is associated with the objective lens array 241. The bean shaping array 262 may be down-beam of the objective lens array 241. For example, the beam shaping array 262 may comprise a plate that is attached to the down-beam electrode 243 of the objective lens array 241. The plate of the beam shaping array 262 may be integrally formed with the down-beam electrode 243 of the objective lens array 241. Alternatively, the beam shaping array 262 may be distanced from the objective lens array 241. The beam shaping array 262 may be formed as a separate component from any of the electrodes 242, 243 of the objective lens array 241.

As shown in FIG. 13, in some embodiments, the beam shaping array 262 is down-beam of the objective lens array 241. In some embodiments, the beam shaping array 262 is further up-beam, such as even up-beam of the objective lens array 241. For example, the beam shaping array 262 may be connected to or formed integrally with the up-beam electrode 242 of the objective lens array 241. In some embodiments, the beam shaping array 262 is located between the objective lens array 241 and the control lens array 250.

As shown in FIG. 13, the control lens array 250 is associated with the objective lens array 241. As described above, the control lens array 250 may be considered as providing electrodes additional to the electrodes 242, 243 of the objective lens array 241. The additional electrodes of the control lens array 250 allow further degrees of freedom for controlling the electron-optical parameters of the sub-beams. In some embodiments, the control lens array 250 may be considered to be additional electrodes of the objective lens array 241 enabling additional functionality of the respective objective lenses of the objective lens array 241. In an arrangement such electrodes may be considered part of the objective lens array providing additional functionality to the objective lenses of the objective lens array 241. In such an arrangement, the control lens is considered to be part of the corresponding objective lens, even to the extent that the control lens is only referred to as being a part of the objective lens.

As shown in FIG. 13, in some embodiments, the control lens array 250 and the objective lens array 241 share a common electrode. In the arrangement shown in FIG. 13, the control lens array 250 comprises three electrodes 253, 254, 255. In some embodiments, the down-beam electrode 255 of the control lens array 250 and the up-beam electrode 242 of the objective lens array 241 form a common electrode. The same conductive plate may be used for both the down-beam electrode 255 of the control lens array 250 and the up-beam electrode 242 of the objective lens array 241. The common electrode arrangement allows for a particularly compact objective lens assembly. In some embodiments, the down-beam electrode 255 of the control lens array 250 is distanced from the up-beam electrode 242 of the objective lens array 241. The electrodes of the control lens array 250 may be separate from the electrodes of the objective lens array 241.

In the arrangement shown in FIG. 13, the control lens array 250 comprises three electrodes 253, 254, 255. In some embodiments, the control lens array 250 may comprise one electrode or two electrodes, for example.

In some embodiments, the controller 50 is configured to control the voltage applied to the middle electrode 254 and the down-beam electrode 255 of the control lens array 250 in order to adjust the focus of the incoming sub-beams. The focus of the sub-beams may be such that the beam shaping array 262 is no longer beam-limiting (or is less beam-limiting). More, or possibly all, of the sub-beam current passes the beam shaping array 262 of the electron-optical device 41. The dimension of the apertures of the beam shaping array is independent of the requirements of the flooding mode. That is the flooding mode does not require that the apertures of the beam shaping take any particular dimension. The dimension of the beam shaping apertures is determined at least in part by the requirements for illuminating the sample with the light beams, the electron-optical specifications of the electron-optical device 41 in an assessment mode, or both.

In some embodiments, the controller 50 is configured to control the objective lenses of the objective lens array 241 to operate as accelerating lenses. The controller 50 may control the voltages applied to the electrodes 242, 243 of the objective lens array 241 such that the objective lenses accelerate the electrons of the sub-beams toward the sample 208.

In some embodiments, the controller 50 is configured to control the objective lenses of the objective lens array 241 to operate as decelerating lenses. The controller 50 may control the voltages applied to the electrodes 242, 243 of the objective lens array 241 such that the objective lenses decelerate the electrons of the sub-beams that are projected toward the sample 208.

The controller 50 is configured to adjust the voltages applied to the electrodes 242, 243 during use of the electron-optical device 41. In some embodiments, the controller 50 is configured to control the objective lenses to switch between accelerating and decelerating electrons projected toward the sample 208.

As shown in FIG. 13, in some embodiments, the electron-optical device 41 comprises the sub-beam forming array 252. The sub-beam forming array 252 is configured to split an electron beam into the electron multi-beam comprising the sub-beams. Thus the sub-beam forming array 252 generates sub-beams of the electron multi-beam from an electron beam, for example, from the electron source 201. In some embodiments, the sub-beam forming array 252 is provided separately from the electron-optical device 41. The electron-optical device 41 and the sub-beam forming array 252 may be combined together in the electron apparatus 40. The apertures in the sub-beam forming array 252 may be sized to maximize the current of the generated sub-beams. The geometry of the sub-beam forming array 252 may contribute to determine the highest current applied by the sub-beams to a sample during a flooding mode. As a flooding mode may be used in combination with an optical illumination for example for a voltage contrast illumination, the relative size between the apertures of the sub-beam forming array 252 and the beam shaping array 262 may be determined by the requirements for illumination of the sample with light. This is because the apertures of the beam shaping array 262 are independent of the requirements of a flooding mode; that is the dimensions of the apertures of the beam shaping array 262 are not determined by the requirements of the electron-optical device 41 for a flooding mode.

In some embodiments, the apertures of the sub-beam forming array 252 define a pattern. The pattern may be a grid. The grid comprises the apertures regularly arranged. Alternatively, the apertures may be irregularly arranged. In some embodiments, the grid is hexagonal or rectilinear. A hexagonal grid may allow a greater density of sub-beams per unit area. The electron beam from the electron source 201 may interact with the sub-beam forming array 252 to generate a multi-beam arrangement or an array of sub-beams. The multi-beam arrangement (or the array of sub-beams) may have a pattern corresponding to the pattern of the gird, for example in which each sub-beam corresponds to an aperture defined in the sub-beam forming array 252.

In the arrangement shown in FIG. 13, the sub-beam forming array 252 is associated with the control lens array 250. For example, the sub-beam forming array 252 may be associated with the up-beam electrode 253 of the control lens array 250. In some embodiments, the sub-beam forming array 252 provides a most up-beam electrode 253 of the control lens array 250. For example, the sub-beam forming array 252 may comprise a plate that is connected to or is integrally formed with the up-beam electrode 253. In some embodiments, the sub-beam forming array 252 is provided as a physically separate component from the electrodes 253, 254, 255 of the control lens array 250.

As shown in FIG. 13, in some embodiments, the sub-beam forming array 252 is up-beam of the control lens array 250. As shown in FIG. 13, in some embodiments, the electron-optical device 41 comprises the detector 240. The detector 240 may be formed as a detector array comprising a plurality of detector elements 405 at a position along the beam path configured to detect signal particles emitted from the sample 208. In some embodiments, the detector elements 405 are associated with respective sub-beams of the electron multi-beam.

As shown in FIG. 13, in some embodiments, at least part of the detector 240 is between the control lens array 250 and the sample 208. That is the detector 240 may comprise at least two arrays each located at different positions along the primary beam path towards the sample 208. The detector arrays of such a detector 240 may thus be distributed at different positions of the electron-optical column for example as different two dimensional detector arrays. In some embodiments, all of the detector array is between the control lens array 250 and the sample 208; that is no detector array of the detector 240 is located up-beam of the control lens array 250. In some embodiments, part of the detector 240 is between the control lens array 250 and the sample 208 and part of the detector 240 is up-beam of the control lens array 250. For example, FIG. 6 shows an example in which the detector 240 has a detector array up-beam (with respect to the direction of primary or sub-beam towards the sample 208, i.e. the direction of the electrons projected toward the sample 208) of the control lens array 250. In some embodiments, all of the detector 240 is up-beam of the control lens array 250.

As shown in FIG. 13, in some embodiments, at least part of the detector 240 (for example a detector array of the detector 240) is between the beam shaping array 262 and the sample 208. For example, as shown in FIG. 13 in some embodiments, the detector 240 is associated with the objective lens array 241. The detector 240 may take the form of one detector array. In a different arrangement the detector 240 may have more than one detector array at least one of which located up-beam of the detector array depicted in FIG. 13 and which additional detector array is not depicted in FIG. 13. The detector 240 may form the final surface of the electron-optical device 41 up-beam of the sample 208. The detector 240 faces the sample 208; that is the detector elements in the detector array may face the sample 208. The detector 240 may be supported by a plate that is fixed relative to the down-beam electrode 243 of the objective lens array 241 and/or the beam shaping array 262.

In some embodiments, the controller 50 is configured to control the electron apparatus 40 to operate to detect signal particles emitted by the sample 208. In such control of the electron apparatus 40 with the controller 50, the multi-beam is used when the sub-beams are shaped by the beam shaping array 262. Such shaped sub-beams may mean less than the threshold current of electrons of each sub-beam passes through the respective apertures of the beam shaping array 262. The signal particles are detected when the inspection current is provided to the sample 208. The detection may not be performed when a flooding current is provided. That is, the detector elements are controlled for example by the controller 50 (or another controller) to be out of operation, the detector elements of the detector are controlled so that they do not transmit a detection signal and/or a detection signal generated by the detector elements are not processed by processors that process the detector signal during the inspection mode.

As shown in FIG. 13, the apertures of the beam shaping array 262 are dimensionally smaller than the respective apertures of the control lens array 250. The beam shaping array 262 provides the limiting factor for the current of electrons of the sub-beams that is projected toward the sample 208. During inspection, (i.e. the inspection mode), the beam shaping array 262 is preferably proximate the sample 208 is configured to shape (e.g. limit) the sub-beams.

In some embodiments, the electron apparatus 40 comprises a plurality of electron-optical devices as depicted in the figures, for example at least FIG. 3 and FIG. 4, subject to the following comments, as a multi-column apparatus. Such a multi-column apparatus may comprise a plurality of electron-optical columns arranged in an array such as in a rectangular or hexagonal pattern. Each column of the multi-column apparatus may feature the features and functionality of the arrangement depicted in and disclosure in reference to FIG. 3 herein. Alternatively, the multi-column apparatus may comprise a plurality of columns that are arranged in an array for example having a regular pattern and that comprise the features and functionality of the electron-optical device 41 depicted in and described with reference to FIG. 4 subject to the following differences. Such differences include having an array of collimators, such as collimating deflectors for example integrated into the objective lens array assembly for example associated with, preferably immediately down beam of, an aperture of the sub-beam forming array 252. Each collimating deflector is assigned to a respective sub-beam of the multi-beam. The differences may comprise an array of scan deflectors integrated into the objective lens array assembly for example associated with the objective lens array 241. Having a scan deflector array and collimator array is beneficial because such devices are electrostatic instead of magnetic. Electron-optical column architectures having magnetic devices are difficult to integrate into a multi-column arrangement because of the interference of the magnetic device with the surrounding columns of the multi-column arrangement.

In some embodiments, there is provided a method for projecting an electron multi-beam toward a sample 208.

In some embodiments, the method comprises emitting an electron beam. In some embodiments, the method comprises projecting toward the sample 208 sub-beams of an electron multi-beam derived from the electron beam using an electron-optical device. The electron multi-beam may be for detecting defects of the sample 208.

In some embodiments, the electron beam is emitted to be angled relative to the central axis of the electron-optical device 41. In some embodiments, the method comprises deflecting the electron beam to be aligned with a central axis of the electron-optical device 41.

In some embodiments, the method comprises emitting light. In some embodiments, the method comprises projecting the light (or the light paths) along paths of the sub-beams through the electron-optical device 41 so as to irradiate the sample 208. In some embodiments, the method is for preparing the sample 208 for voltage contrast measurement. The light may be for preparing the sample 208 for voltage contrast measurement.

In some embodiments, the method comprises flooding a surface of the sample 208 with charged particles. In some embodiments, both flooding (with electrons) and illumination with light are performed in order to increase the contrast for inspection of certain defects.

In some embodiments, the method is for preparing the sample 208 for voltage contrast measurement and performing the voltage contrast measurement (i.e. by an inspection process). In some embodiments, the method is for preparing the sample 208 for voltage contrast measurement and performing the voltage contrast measurement (i.e. by an inspection process). Suitable apparatus and associated method for such illumination of a sample and/or for such a voltage contrast measurement is herein disclosed and described.

Reference to a component or system of components or elements being controllable to manipulate an electron beam in a certain manner includes configuring a controller or control system or control unit to control the component to manipulate the electron beam in the manner described, as well optionally using other controllers or devices (e.g. voltage supplies and or current supplies) to control the component to manipulate the electron beam in this manner. For example, a voltage supply may be electrically connected to one or more components to apply potentials to the components, such as in a non-limited list the control lens array 250, the objective lens array 241, the condenser lenses 231, correctors, a collimator element array and scan deflector array, under the control of the controller or control system or control unit. An actuatable component, such as a stage, may be controllable to actuate and thus move relative to another components such as the beam path using one or more controllers, control systems, or control units to control the actuation of the component.

The embodiments herein described may take the form of a series of aperture arrays or electron-optical elements arranged in arrays along a beam or a multi-beam path. Such electron-optical elements may be electrostatic. In some embodiments, all the electron-optical elements, for example from a sub-beam forming array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques).

References to upper and lower, up and down, above and below should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

An electron apparatus according to some embodiments of the disclosure may be a tool which makes a qualitative assessment of a sample (e.g. pass/fail), one which makes a quantitative measurement (e.g. the size of a feature) of a sample or one which generates an image of map of a sample. Examples of assessment systems are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools). The electron-optical column may be a component of an assessment system; such as an inspection tool or a metro-inspection tool, or part of an e-beam lithography tool. Any reference to a tool herein is intended to encompass a device, apparatus or system, the tool comprising various components which may or may not be collocated, and which may even be located in separate rooms, especially for example for data processing elements.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector.

References to elements being aligned along a beam path or sub-beam path are understood to mean that the respective elements are positioned along the beam path or sub-beam path.

While the present invention has been described in connection with various embodiments, other embodiments of the invention will be apparent to those skilled in the art from consideration of the specification and practice of the technology disclosed herein. It is intended that the specification and examples be considered as exemplary only, with a true scope and spirit of the invention being indicated by the following claims and clauses.

There are provided the following clauses: Clause 1: A charged particle apparatus configured to project a charged particle multi-beam toward a sample, the charged particle apparatus comprising: a charged particle source configured to emit a charged particle beam; a light source configured to emit light; and a charged particle-optical device configured to project toward the sample sub-beams of a charged particle multi-beam derived from the charged particle beam; wherein the light source is arranged such that the light is projected along paths of the sub-beams (preferably the full length of the paths of the sub-beams), desirably the light is projected along light paths that are along the paths of the sub-beams, through the charged particle-optical device so as to irradiate at least a portion of the sample.

Clause 2: The charged particle apparatus of clause 1, comprising at least one, desirably two, charged particle-optical elements comprising respective array of apertures, the apertures of the respective arrays of apertures of the respective charged particle-optical elements corresponding to respective sub-beams of the charged particle multi-beam, desirably the light is projected along paths of the sub-beams through the apertures of respective sub-beams, desirably the charged particle device comprises the at least one, desirably two, charged particle-optical elements.

Clause 3: The charged particle apparatus of clause 1 or 2, wherein the light source is adjacent to the charged particle source.

Clause 4: The charged particle apparatus of any preceding clause, wherein the light source is arranged such that the charged particle beam, in plan view, is radially inward of the light, for example at a position along the charged particle beam that is, up-beam of the charged particle-optical device.

Clause 5: The charged particle apparatus of any preceding clause, wherein the charged particle source is located between the light source and the sample.

Clause 6: The charged particle apparatus of any of clauses 1 to 4, wherein the light source is located between the charged particle source and the sample.

Clause 7: The charged particle apparatus of any preceding clause, wherein the light source is located at least two positions spaced from, in plan view, the charged particle beam, for example the light source comprises different parts that are configured to be located at the different positions or the light source is configured to extends between the different positions.

Clause 8: The charged particle apparatus of clause 7, wherein the positions are equidistantly spaced from each other.

Clause 9: The charged particle apparatus of clause 7 or 8, wherein the positions are at a similar radial distance from the charged particle source.

Clause 10: The charged particle apparatus of any of clauses 7 to 9, wherein the positions surround the charged particle source.

Clause 11: The charged particle apparatus of any of clauses 7 to 10, wherein the positions are continuous so as to form an arc spaced from, in plan view, the charged particle source.

Clause 12: The charged particle apparatus of any of clauses 7 to 10, wherein the positions form an annulus surrounding the charged particle source.

Clause 13: The charged particle apparatus of any preceding clause, wherein the light source is arranged such that the light comprises a plurality of light beams and the charged particle beam is between the plurality of light beams up-beam of the charged particle-optical device.

Clause 14: The charged particle apparatus of any preceding clause, wherein the light source is arranged such that a path of the light, or a light path, towards the sample is aligned with a central axis of the charged particle-optical device.

Clause 15: The charged particle apparatus of any preceding clause, comprising a charged particle-optical deflector configured to deflect the charged particle beam to be aligned with a central axis of the charged particle-optical device.

Clause 16: The charged particle apparatus of clause 15, wherein the charged particle source is offset from the central axis of the charged particle-optical device.

Clause 17: The charged particle apparatus of clause 15 or 16, wherein the charged particle source is arranged to emit the charged particle beam to be angled relative to the central axis of the charged particle-optical device.

Clause 18: The charged particle apparatus of any of clauses 1 to 17, wherein the charged particle-optical device comprises: an objective lens array comprising a plurality of objective lenses configured to focus respective sub-beams of the charged particle multi-beam on the sample, desirably the objective lens array is an electrostatic lens array for example comprising a plurality of electrodes arranged along the paths of the sub-beams, desirably the objective lens array comprising at least two plates in which a plurality of apertures are defined.

Clause 19: The charged particle apparatus of clause 18 (or clauses 1 to 17), wherein the charged particle-optical device comprises: a sub-beam forming array comprising a plate in which are defined apertures configured to split the charged particle beam into a charged particle multi-beam comprising a plurality of sub-beams.

Clause 20: The charged particle apparatus of clause 19, wherein the apertures defined in the sub-beam forming array have a diameter of at least 50 μm for respective sub-beams of the charged particle multi-beam.

Clause 21: The charged particle apparatus of clause 19 or 20, wherein the apertures of the sub-beam forming array define a pattern in the plate of the sub-beam forming array.

Clause 22: The charged particle apparatus of clause 21, wherein the pattern is a grid.

Clause 23: The charged particle apparatus of clause 22, wherein the grid is hexagonal or rectilinear.

Clause 24: The charged particle apparatus of any of clauses 19 to 23 (or clauses 1 to 17), wherein the charged particle-optical device comprises: a beam shaping array comprising a plate in which are defined a plurality of apertures, wherein the apertures of the beam shaping array are for shaping respective sub-beams of the charged particle multi-beam.

Clause 25: The charged particle apparatus of clause 24, wherein the beam shaping array is down-beam of a most up-beam electrode of the objective lens array.

Clause 26: The charged particle apparatus of clause 25, wherein the beam shaping array is down-beam of the objective lens array.

Clause 27: The charged particle apparatus of any of clauses 24 to 26, wherein the apertures of the beam shaping array are dimensioned smaller than the apertures of the sub-beam forming array.

Clause 28: The charged particle apparatus of clause 27, wherein the apertures of the beam shaping array have a diameter of at least 20 μm.

Clause 29: The charged particle apparatus of clause 27 or 28, wherein the light source is configured to emit light having a wavelength, wherein the apertures of the beam shaping array have a dimension of at least a diffraction threshold, the diffraction threshold preferably being dependent on the wavelength of the light that the light source is configured to emit.

Clause 30: The charged particle apparatus of any of clauses 18 to 29 (or any of clauses 1 to 17), wherein the charged particle-optical device comprises: a control lens array comprising a plurality of control lenses for manipulating respective sub-beams of the charged particle multi-beam.

Clause 31: The charged particle apparatus of clause 30, wherein the objective lens array is down-beam of the control lens array, preferably wherein the sub-beam forming array defines or provides a most up-beam electrode of the control lens array or the objective lens array, or the sub-beam forming array is up-beam of the most up-beam electrode of the control lens array.

Clause 32: The charged particle apparatus of clause 31, wherein the beam shaping array is down-beam of the control lens array.

Clause 33: The charged particle apparatus of any preceding clause, wherein the charged particle-optical device comprises: at least one detector array comprising a plurality of detector elements configured to detect signal particles emitted from the sample.

Clause 34: The charged particle apparatus of clause 33, wherein the detector elements are associated with respective sub-beams of the charged particle multi-beam and preferably in which detector array are defined a plurality of apertures, each aperture assigned to a respective sub-beam of the charged particle multi-beam.

Clause 35: The charged particle apparatus of any preceding clause, wherein the portion of the sample irradiated by the light corresponds to a portion that subsequently receives a charged particle beam.

Clause 36: The charged particle apparatus of any preceding clause, wherein the charged particles are electrons.

Clause 37: The charged particle apparatus of any preceding clause, wherein the paths of the light through apertures of charged particle-optical elements of the charged particle-optical device are substantially straight.

Clause 38: The charged particle apparatus of any preceding clause, wherein apertures defined in charged particle-optical elements of the charged particle-optical device (such as the sub-beam forming array, the control lens array, the objective lens array, the beam shaping array and/or detector array) are aligned such that the paths along which the light is projected are substantially straight.

Clause 39: A method for projecting a charged particle multi-beam toward a sample, the method comprising: emitting a charged particle beam; projecting toward the sample sub-beams of a charged particle multi-beam derived from the charged particle beam using a charged particle-optical device; emitting light; and projecting the light along paths of the sub-beams through the charged particle-optical device so as to irradiate the sample.

Clause 40: The method of clause 39, comprising flooding a surface of the sample with charged particles.

Clause 41: The method of clause 39 or 40, wherein the method is for preparing the sample for voltage contrast measurement.

Clause 42: The method of any of clauses 39 to 41, comprising: deflecting the charged particle beam to be aligned with a central axis of the charged particle-optical device.

Clause 43: The method of any of clauses 39 to 42, wherein the charged particle beam is emitted to be angled relative to the central axis of the charged particle-optical device.

The descriptions above are intended to be illustrative, not limiting. Thus, it will be apparent to one skilled in the art that modifications may be made as described without departing from the scope of the claims set out below and the clauses set out herein.

The invention claimed is:

1. A charged particle apparatus configured to project a charged particle multi-beam toward a sample, the charged particle apparatus comprising:

a charged particle source configured to emit a charged particle beam;

a light source configured to emit light;

a charged particle-optical device configured to project toward the sample sub-beams of a charged particle multi-beam derived from the charged particle beam; the charged particle-optical device comprising at least one charged particle-optical element comprising respective array of apertures, the apertures of the respective arrays of apertures of the respective charged particle-optical elements corresponding to respective sub-beams of the charged particle multi-beam, wherein the light source is arranged such that the light is projected along paths of the sub-beams through the charged particle-optical device so along paths of the sub-beams through the apertures of respective sub-beams of the at least one charged particle element so as to irradiate at least a portion of the sample.

2. The charged particle apparatus of claim 1, wherein the light source is adjacent to the charged particle source.

3. The charged particle apparatus of claim 1, wherein the light source is arranged such that the charged particle beam, in plan view, is radially inward of the light at a position along the of the charged particle beam that is up-beam of the charged particle-optical device.

4. The charged particle apparatus of claim 1, wherein the charged particle source is located between the light source and the sample.

5. The charged particle apparatus of claim 1, wherein the light source is located between the charged particle source and the sample.

6. The charged particle apparatus of claim 1, wherein the light source is located at least two positions spaced from, in plan view, the charged particle beam.

7. The charged particle apparatus of claim 6, wherein the positions are equidistantly spaced from each other.

8. The charged particle apparatus of claim 6, wherein the positions surround the charged particle source.

9. The charged particle apparatus of claim 6, wherein the at least two positions form an annulus surrounding the charged particle source.

10. The charged particle apparatus of claim 1, wherein the light source is arranged such that the light comprises a plurality of light beams and the charged particle beam is between the plurality of light beams up-beam of the charged particle-optical device.

11. The charged particle apparatus of claim 1, wherein the light source is arranged such that a path of the light towards the sample is aligned with a central axis of the charged particle-optical device.

12. The charged particle apparatus of claim 1, comprising a charged particle-optical deflector configured to deflect the charged particle beam to be aligned with a central axis of the charged particle-optical device.

13. The charged particle apparatus of claim 12, wherein the charged particle source is arranged to emit the charged particle beam to be angled relative to the central axis of the charged particle-optical device.

14. The charged particle apparatus of claim 1, wherein the charged particle-optical device comprises:

an objective lens array comprising a plurality of objective lenses configured to focus respective sub-beams of the charged particle multi-beam on the sample.

15. The charged particle apparatus of claim 1, wherein the charged particle-optical device comprises:

a sub-beam forming array comprising a plate in which are defined apertures configured to split the charged particle beam into the charged particle multi-beam comprising a plurality of sub-beams.

16. A method for projecting a charged particle multi-beam toward a sample, the method comprising:

emitting a charged particle beam;

projecting toward the sample sub-beams of a charged particle multi-beam derived from the charged particle beam using a charged particle-optical device;

emitting light; and projecting the light along paths of the sub-beams through the charged particle-optical device so as to irradiate the sample.

17. The method of claim 16, further comprising flooding a surface of the sample with charged particles.

18. The method of claim 16, comprising:

deflecting the charged particle beam to be aligned with a central axis of the charged particle-optical device.

19. The method of claim 18, wherein the charged particle beam is emitted to be angled relative to the central axis of the charged particle-optical device.

20. A charged particle apparatus configured to project a charged particle multi-beam toward a sample, the charged particle apparatus comprising:

a charged particle source configured to emit a charged particle beam;

a light source configured to emit light; and a charged particle-optical device configured to project toward the sample sub-beams of a charged particle multi-beam derived from the charged particle beam;

wherein the light source is arranged such that the light is projected along paths of the sub-beams through the charged particle-optical device so as to irradiate at least a portion of the sample, wherein at least one of:

the light source is adjacent to the charged particle source, the light source is arranged such that the charged particle beam, in plan view, is radially inward of the light up-beam of the charged particle-optical device, the charged particle source is located between the light source and the sample; or the light source is located at at least two positions spaced from, in plan view, the charged particle beam.

* * * * *